(12) United States Patent
Hsiao et al.

(10) Patent No.: US 8,109,407 B2
(45) Date of Patent: Feb. 7, 2012

(54) APPARATUS FOR STORING SUBSTRATES

(75) Inventors: Yi-Li Hsiao, Hsinchu (TW); Chen-Hua Yu, Hsin-Chu (TW); Jean Wang, Hsin Chu (TW); Jui-Pin Hung, Hsinchu (TW); Ming-Shih Yeh, Chupei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1241 days.

(21) Appl. No.: 11/755,508

(22) Filed: May 30, 2007

(65) Prior Publication Data

US 2008/0295412 A1  Dec. 4, 2008

(51) Int. Cl.
*B65D 45/28* (2006.01)
*B65D 53/06* (2006.01)

(52) U.S. Cl. ......... 220/323; 220/228; 220/239; 220/378

(58) Field of Classification Search ............. 220/228, 220/323, 324, 235, 238, 378, 239; 277/627
See application file for complete search history.

(56) References Cited

U.S. PATENT DOCUMENTS

| | | | | | |
|---|---|---|---|---|---|
| 2,875,918 | A | * | 3/1959 | Baumier | 220/323 |
| 3,694,145 | A | * | 9/1972 | Stevens | 49/318 |
| 3,820,682 | A | * | 6/1974 | Davella | 220/315 |
| 3,896,663 | A | * | 7/1975 | Ogura | 73/784 |
| 4,467,936 | A | * | 8/1984 | Makhijani | 220/246 |
| 4,763,511 | A | * | 8/1988 | Mathison et al. | 73/49.1 |
| 5,543,450 | A | * | 8/1996 | Takita et al. | 524/190 |
| 5,551,707 | A | * | 9/1996 | Pauley et al. | 277/654 |
| 6,286,553 | B1 | * | 9/2001 | Morgan | 138/89 |
| 6,641,349 | B1 | * | 11/2003 | Miyajima et al. | 414/217 |
| 6,845,876 | B2 | * | 1/2005 | Helms, Jr. | 220/234 |
| 2001/0032850 | A1 | * | 10/2001 | Neuner | 220/232 |
| 2002/0074664 | A1 | | 6/2002 | Nogami et al. | |
| 2002/0134784 | A1 | * | 9/2002 | Hsieh et al. | 220/323 |
| 2005/0230398 | A1 | * | 10/2005 | Hasegawa et al. | 220/323 |

OTHER PUBLICATIONS

Eric Lebreton, "Confined Space", Transport Canada Canutec, pp. 1-5, at http://www.tc.gc.ca/canutec/en/articles/documents/confined.htm Mar. 28, 2006.
Official action issued Mar. 23, 2011 in the counterpart Taiwan patent application.

* cited by examiner

*Primary Examiner* — Mickey Yu
*Assistant Examiner* — Niki Eloshway
(74) *Attorney, Agent, or Firm* — Duane Morris LLP

(57) ABSTRACT

An apparatus includes an enclosure and a door configured to seal the enclosure. The door includes a plate. A rotational apparatus is disposed over the plate. At least one first member with a first arm extends from a first rib of the first member. At least one second member with a second arm extends from a second rib of the second member. The first and second arms are connected to the rotational apparatus. At least one corner member has a first edge. The first edge has a shape corresponding to a shape of a corner of the frame. The corner member is connected to a first end of the third arm. A second end of the third arm is connected to the rotational apparatus. A sealing material is disposed along a first longitudinal side of the first rib and a second longitudinal side of the second rib.

21 Claims, 21 Drawing Sheets

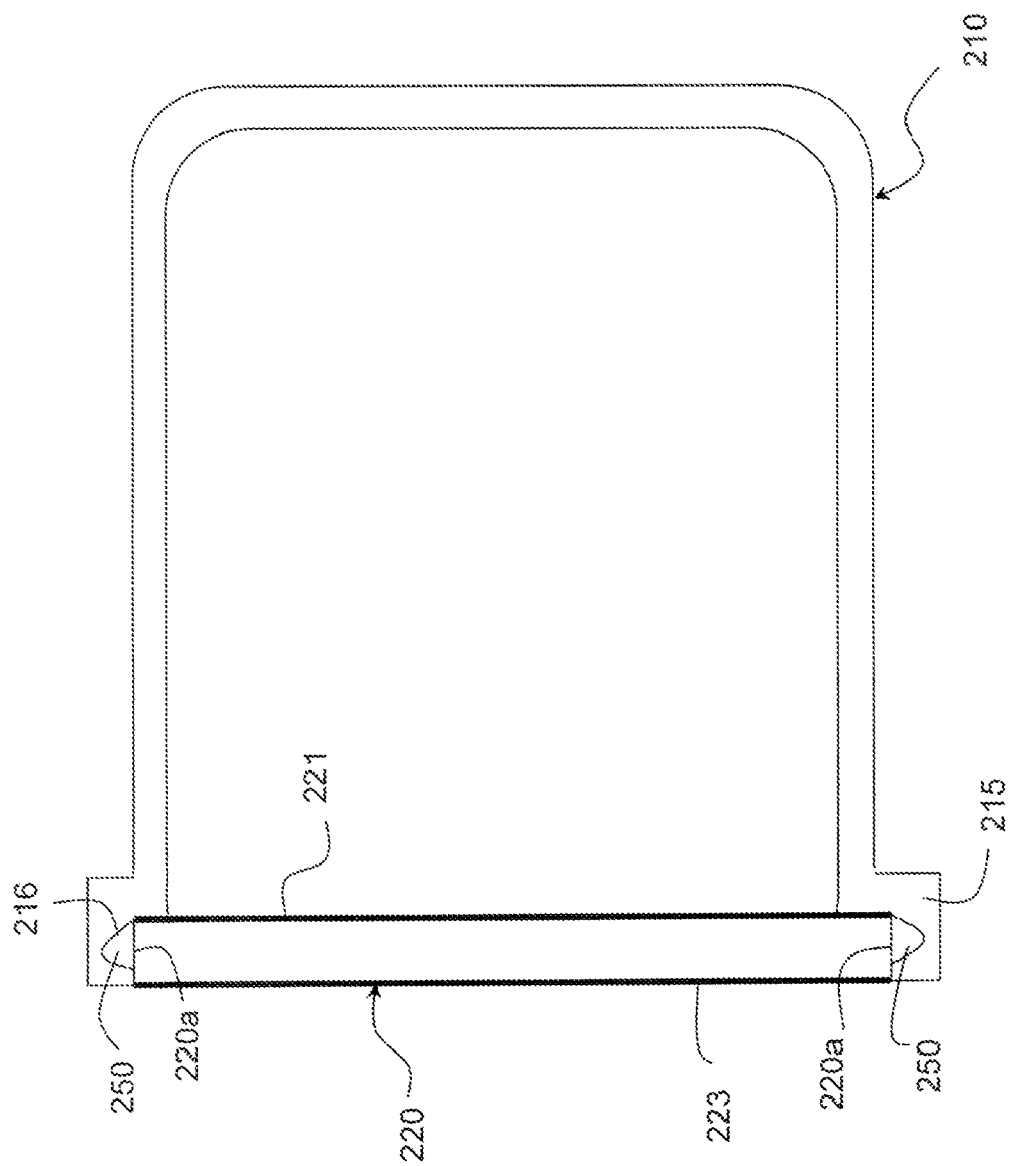

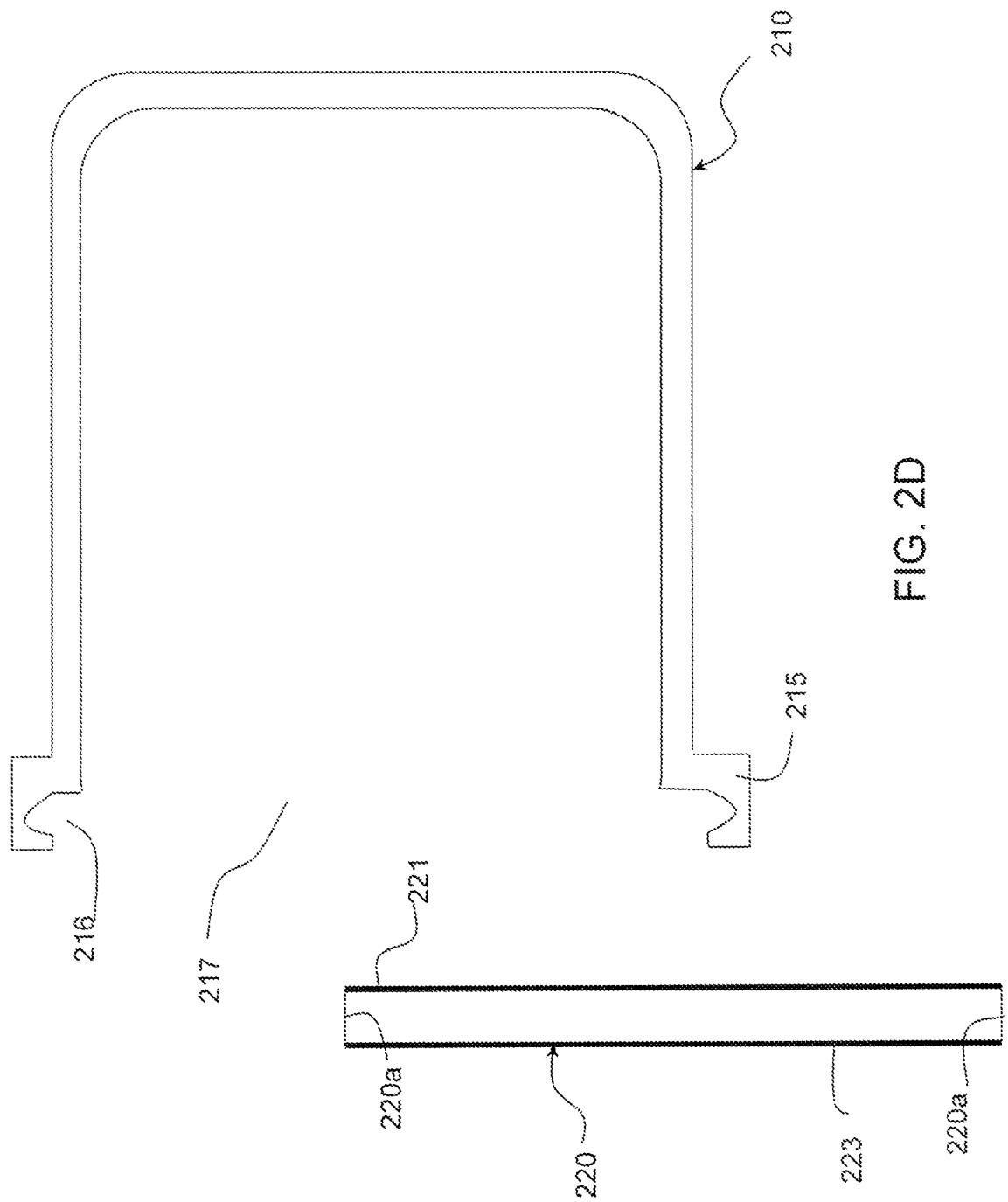

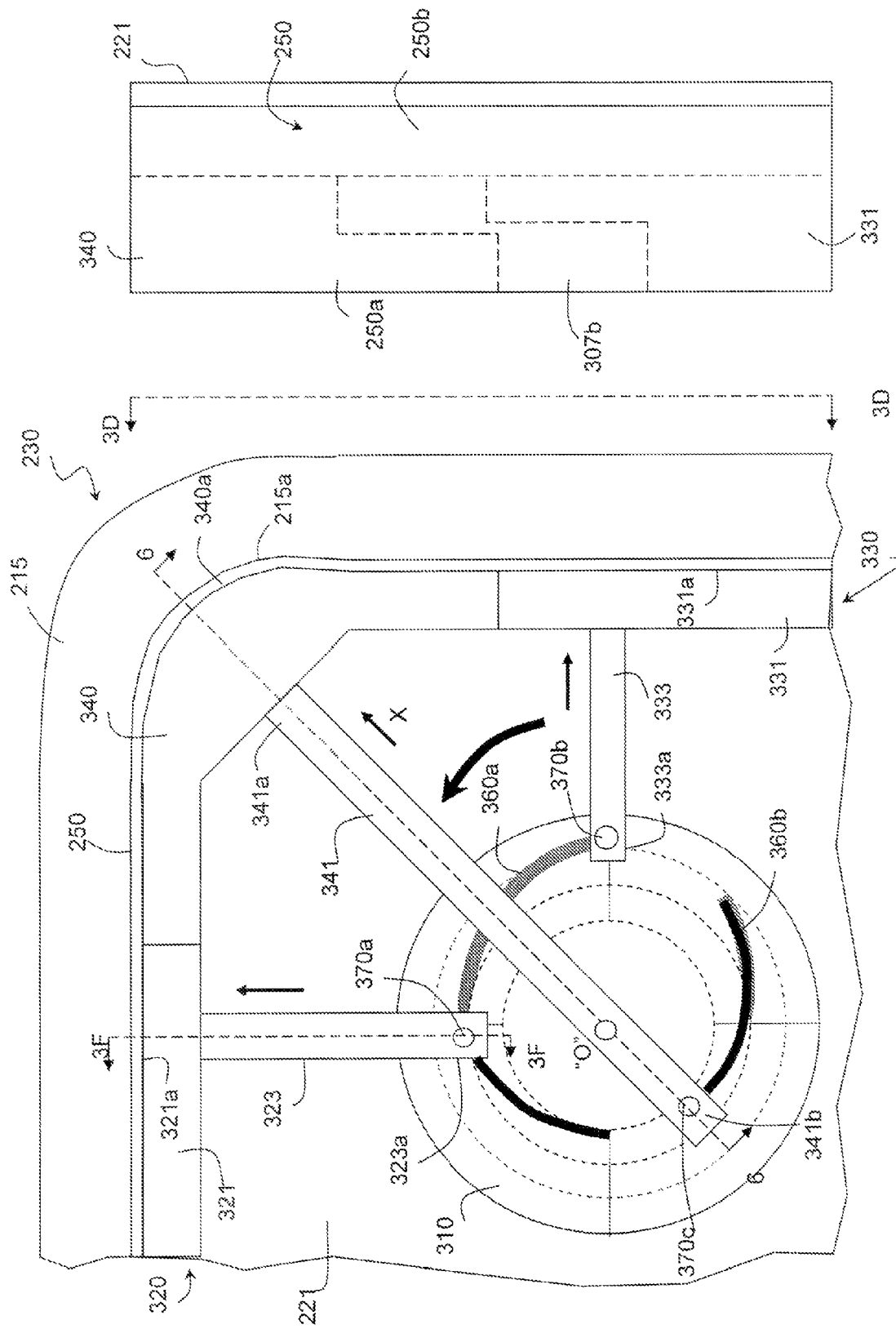

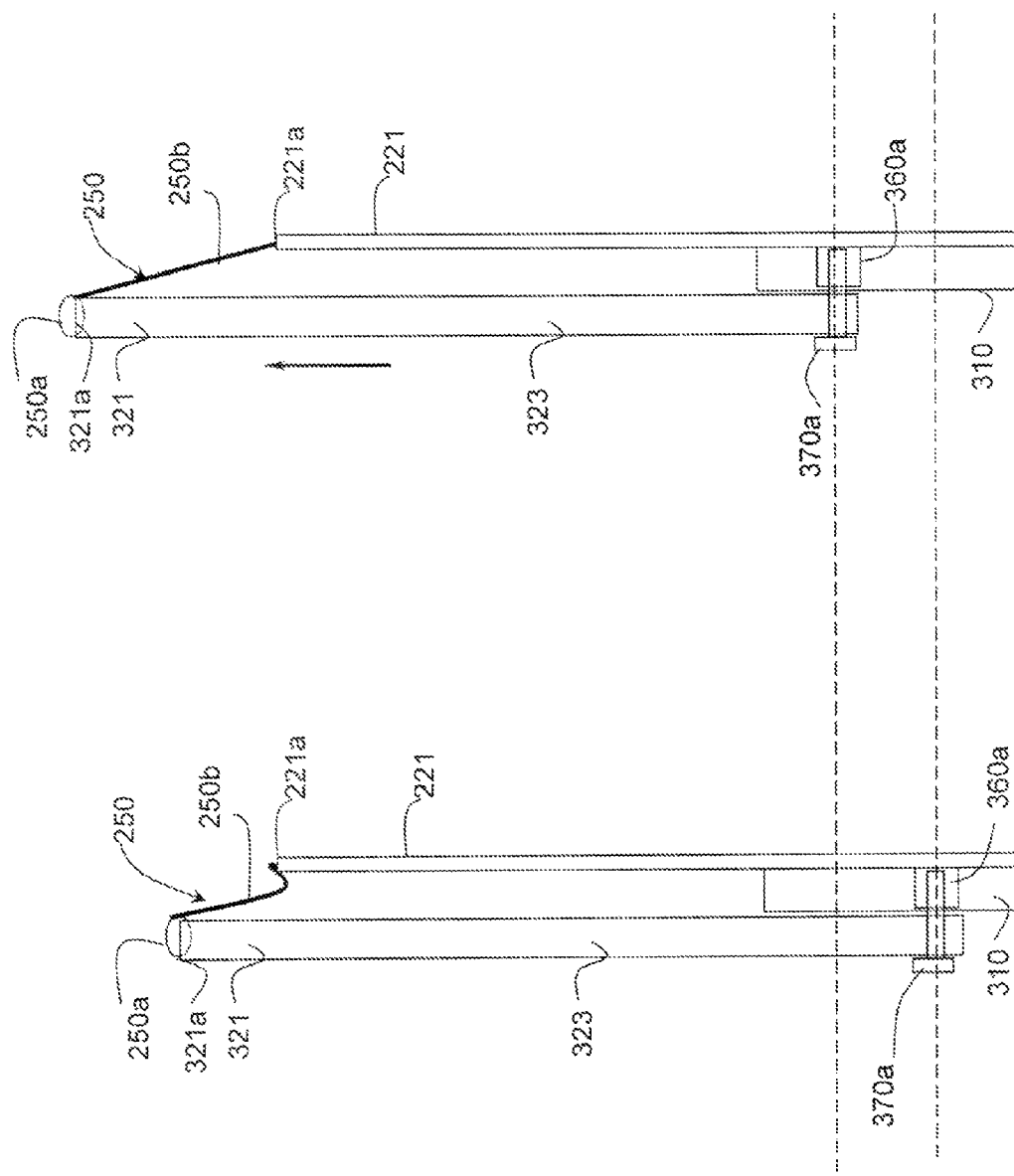

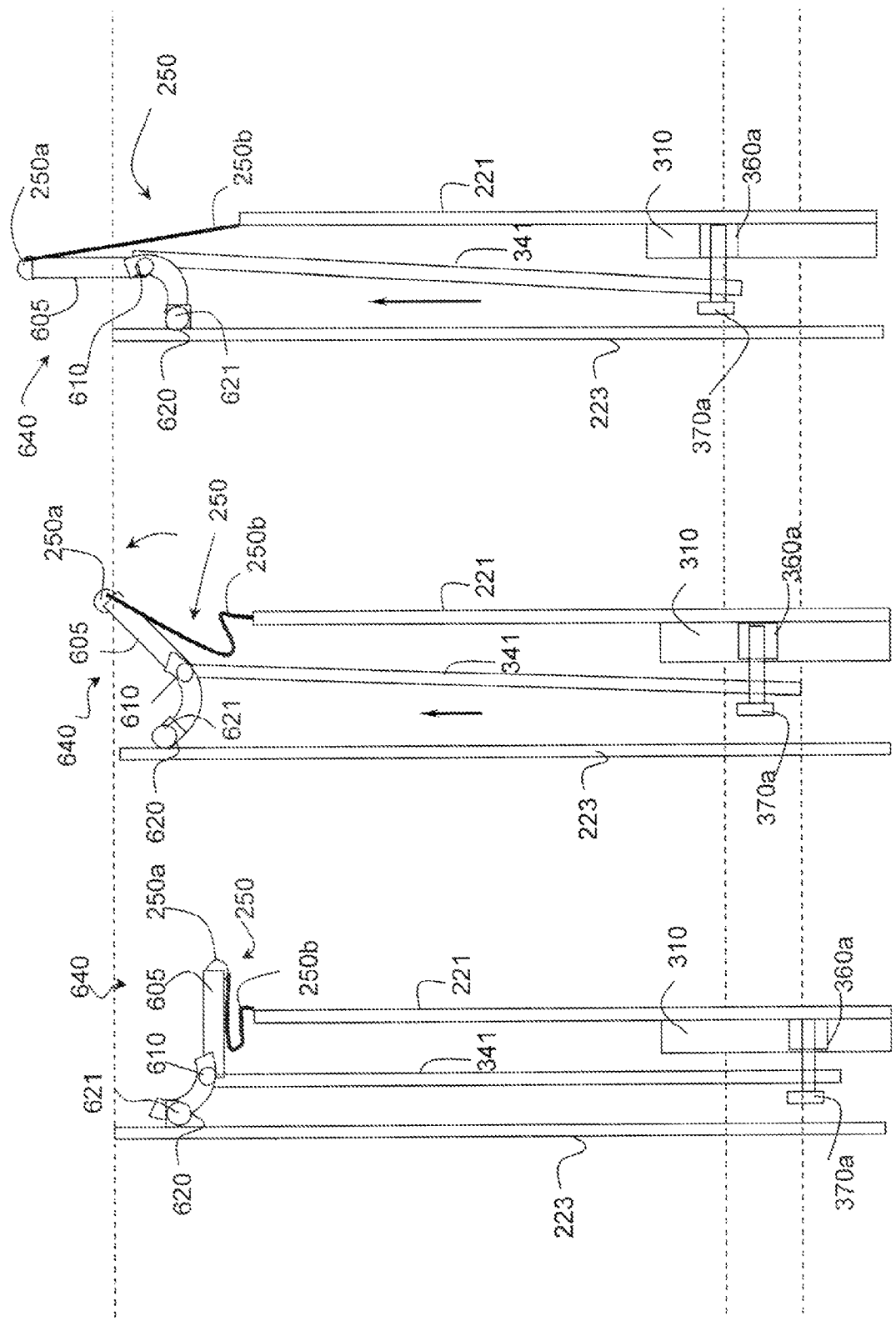

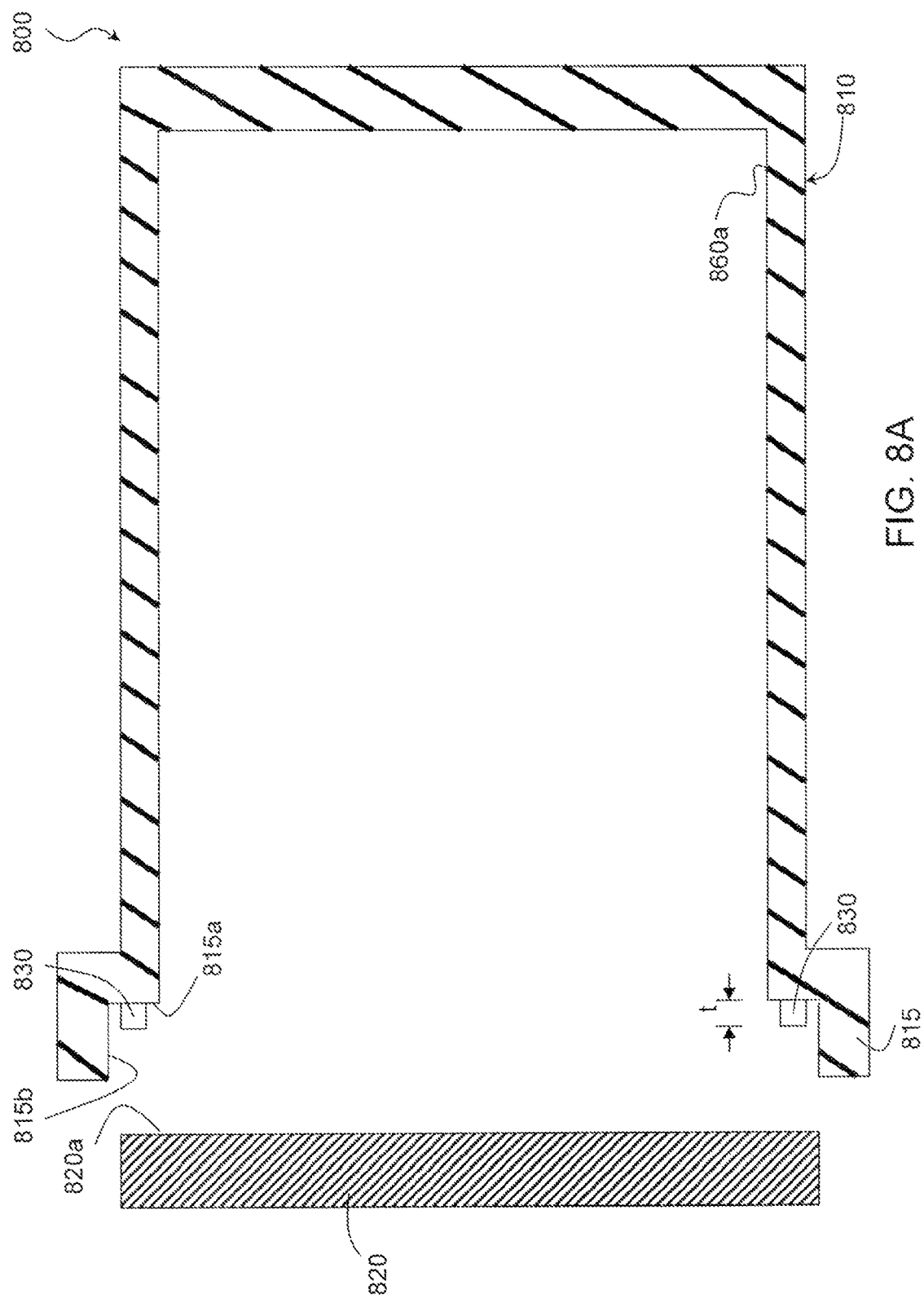

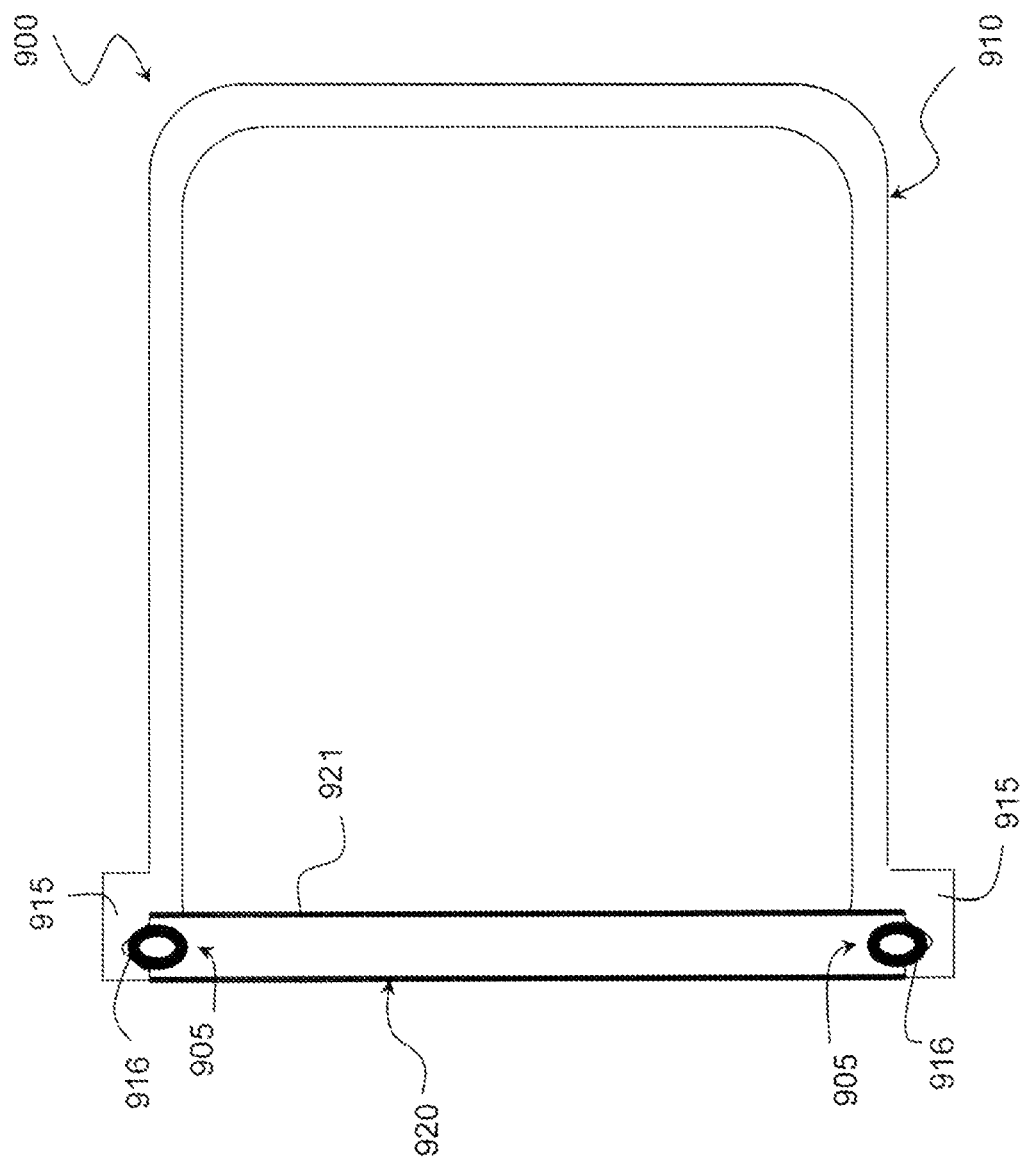

APPARATUS FOR STORING SUBSTRATES

BACKGROUND OF THE INVENTION

1. Field of the Invention

The present invention relates, most generally, to apparatuses for storing substrates, and more particularly to front opening unified pods (FOUPs).

2. Description of the Related Art

With advances in electronic products, semiconductor technology has been applied widely in manufacturing memory devices, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed along with techniques for overcoming manufacturing obstacles associated with these materials and requirements.

FIG. 1A is a schematic drawing showing a traditional via hole structure. A copper layer 110 is formed over a substrate 100. An ultra low-k dielectric layer 120 is formed over the copper layer 110. A via hole 130 is formed within the ultra low-k dielectric layer 120 to expose the top surface of the copper layer 110. If the copper layer 110 is exposed to air, the top surface of the copper layer 110 reacts with oxygen in air, forming a copper oxide layer 140 due to oxidation. The copper oxide layer 140 can adversely affect the electrical connection between the top surface of the copper layer 110 and a conductive via plug filled into the via hole 130. In addition, the ultra low-k dielectric layer 120 absorbs moisture when exposed to air. Accordingly, great care should be taken to avoid exposure to air during critical process steps, such as via opening, the formation of copper seed layers in the via opening, chemical mechanical polishing (CMP) of the copper and formation of the ultra low-k dielectric material.

Traditionally, after a critical process step, the substrate 100 is removed from the process chamber that performs the critical process step and temporarily stored in a FOUP 150 shown in FIG. 1B until subsequent processing. The substrate 100 is stored in the FOUP 150 to reduce the exposure of the copper layer 110 to atmosphere.

FIG. 1B is a schematic cross-sectional view of a prior art FOUP. The FOUP 150 protects wafers stored therein from being contaminated by particles within the environment having airborne molecular contamination (AMC) around the FOUP 150. AMCs in a fab generally come from the process chemicals, outside air, cleanroom materials and process tools. Due to airflow designs in the fab, one area may contaminate adjoining one due to recirculation. Fab exhaust, adequately scrubbed to meet regulatory requirements at parts per million (ppm) levels, can be pulled back into the fab on a calm day by the air intakes, which can cause AMC problems in the fab. Cleanroom construction materials and process equipment can also be a significant source of contamination. The FOUP 150 includes an enclosure 160 and a door 170. The enclosure 160 includes a frame 165. The enclosure 160 also includes outlet check valve 173 and inlet check valve 175.

During removing the door 170 or open the enclosure 160, AMC diffuses into the enclosure 160. After the door 170 is transferred to close the enclosure 160, AMC remains in the enclosure 160. In order to remove AMC in the enclosure 160, the inlet check valve 175 is disposed at the bottom of the enclosure 160 through which nitrogen is provided into the enclosure 160 to carry away AMC from the enclosure 160. Nitrogen provided within the enclosure 160 may push the door 170 away from the enclosure 160. The outlet check valve 173 is disposed at the bottom of the enclosure 160 through which AMC within the enclosure 160 can be removed partially removed.

When the door 170 is configured to close the enclosure 160, the door 170 is transferred and contacts a gasket 180 so as to close the enclosure 160 and prevent particles flowing into the enclosure 160. When the enclosure 160 is removed, the door 170 is unlocked and transferred directly away from the enclosure 160.

Based on the foregoing, an improved apparatus for storing substrates are desired.

SUMMARY OF THE INVENTION

In accordance with some exemplary embodiments, an apparatus includes an enclosure and a door. The enclosure includes an opening and a frame around the opening. The door is configured to seal the opening. The door includes a plate. A rotational apparatus is disposed over the plate. At least one first member having a first arm extends from a first rib of the first member. The first arm is connected to the rotational apparatus. At least one second member having a second arm extends from a second rib of the second member. The second arm is connected to the rotational apparatus. At least one corner member has a first edge. The first edge has a shape corresponding to a shape of a corner of the frame. The corner member is connected to a first end of the third arm. A second end of the third arm is connected to the rotational apparatus. A sealing material is disposed along a first longitudinal side of the first rib and a second longitudinal side of the second rib.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIG. 2C is a schematic cross-sectional view of the exemplary FOUP taken along section line 2C-2C of FIG. 2B.

FIG. 2D is a schematic cross-sectional view of the exemplary FOUP of FIG. 2C when the door is removed from the enclosure.

FIG. 3C is a schematic drawing of the structure of FIG. 3A when the rotational mechanism is 90°-counterclockwise rotated such that the door is configured to seal the enclosure.

FIG. 3D is a schematic side view of the door of FIG. 3C taken along line 3D-3D of FIG. 3C.

FIG. 3E is a schematic cross sectional view of the door taken along line 3E-3E of FIG. 3A.

FIG. 3F is a schematic cross sectional view of the door taken along line 3F-3F of FIG. 3C.

FIGS. 6A-6C are schematic cross-sectional views showing operation of an exemplary corner member and arm taken along line 6-6 of FIG. 6D.

FIG. 8A is a schematic cross-sectional view of an exemplary FOUP with a door and an enclosure, wherein the door does not seal the enclosure.

FIG. 9A is a schematic cross-sectional view showing yet another exemplary FOUP.

DESCRIPTION OF THE PREFERRED EMBODIMENT

Figure 1A:
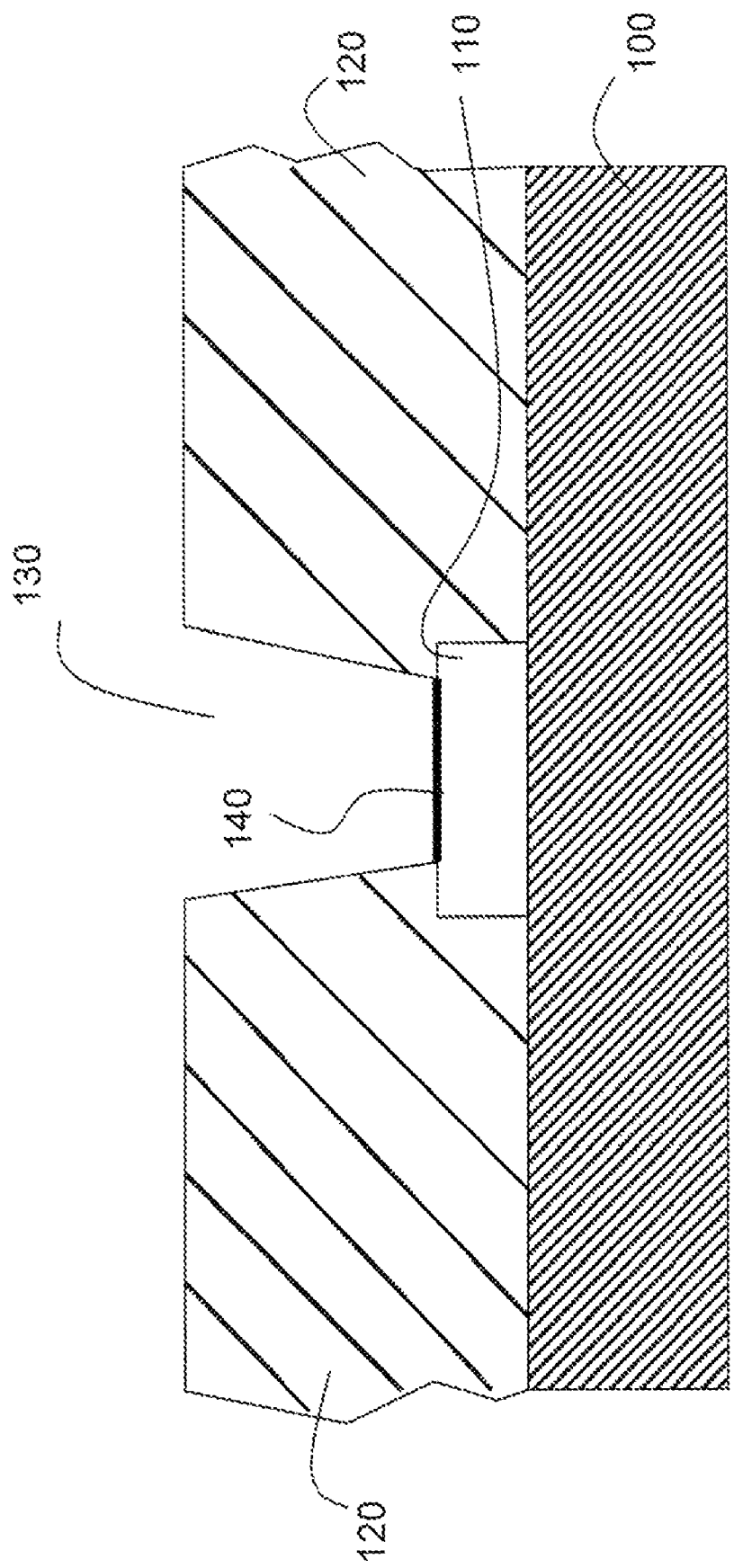
FIG. 1A is a schematic drawing showing a traditional via hole structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

Figure 2A:
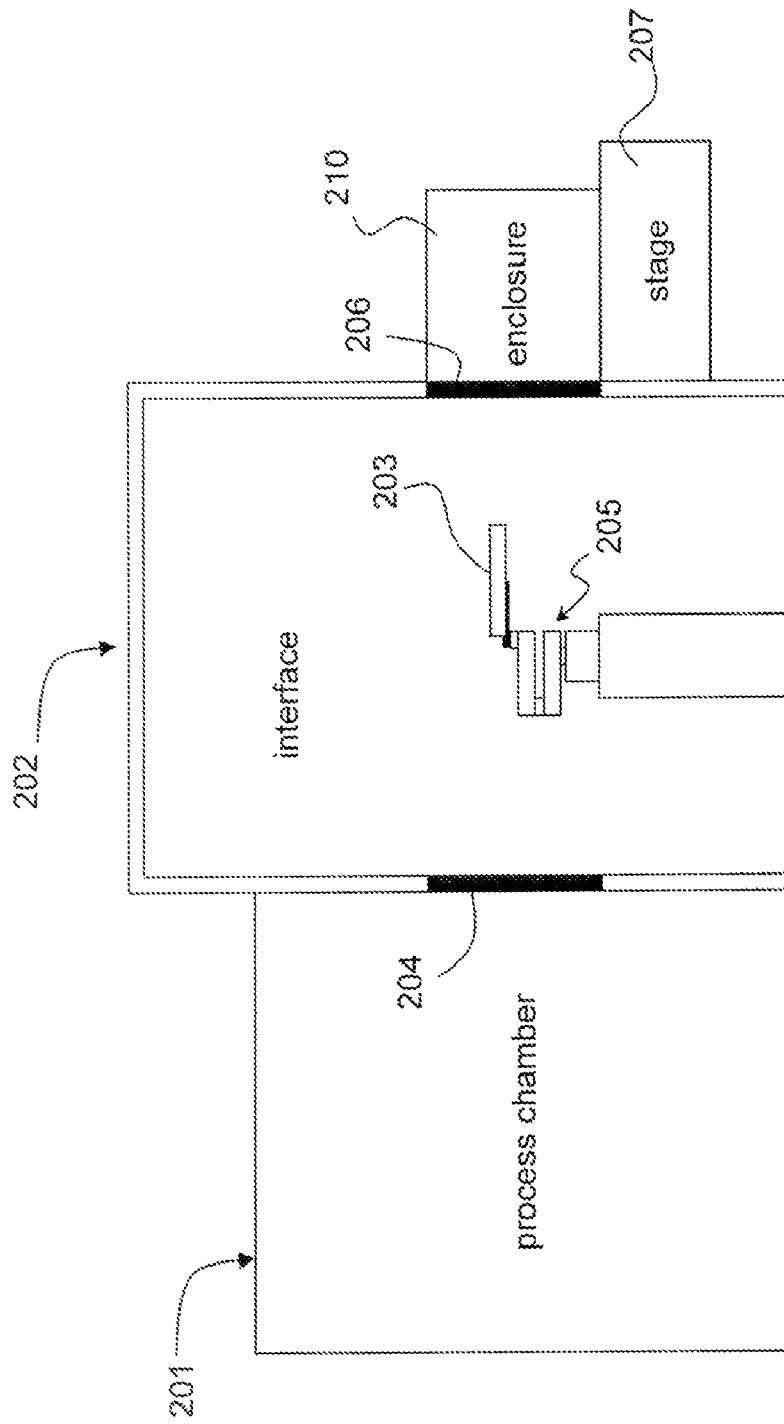
FIG. 2A is a schematic drawing showing an exemplary semiconductor processing system.

FIG. 2A is a schematic drawing showing an exemplary semiconductor processing system.

Referring to FIG. 2A, a semiconductor processing system may comprise, for example, an enclosure 210, a process chamber 201 and an interface 202. The enclosure 210 is disposed over a stage 207. The enclosure 210 may alternately be referred to as a container or storage member but will be referred to hereinafter as an enclosure. The enclosure 210 may be connected to the interface 202 via a door 206, which is configured on a wall of the interface 202. The interface 202 may comprise, for example, a robot system 205 configured to transfer a substrate 203 to or from the enclosure 210 through the door 206. The substrate 203 can be a silicon substrate, a III-V compound substrate, a display substrate such as a liquid crystal display (LCD), plasma display, electro luminescence (EL) lamp display, or a light emitting diode (LED) substrate (collectively referred to as, substrate 203), for example.

In some embodiments, the interface 202 may be connected to a process chamber 201 through a door 204, which is configured on a wall between the process chamber 201 and the interface 202. The process chamber 201 may comprise, for example, at least one etch processing chamber, thin film deposition chamber (e.g., chemical vapor deposition (CVD) chamber, physical vapor deposition (PVD) chamber, other deposition chambers or combinations thereof), photolithographic apparatus, wet bench, chemical-mechanical planarization (CMP) chamber, electrochemical plating chamber, electroless chemical plating chamber, ion implanter, furnace, rapid thermal processing chamber, other semiconductor processing chambers or combinations thereof.

In some embodiments, the interface 202, the process chamber 201 and/or the combination thereof are described in, for example, commonly assigned and copending U.S. patent application Ser. No. 11/419,914, filed on May 23, 2006 and U.S. patent application Ser. No. 11/419,933, filed on May 23, 2006, the entirety of each of which is hereby incorporated herein by reference as if set forth in their entireties.

Figure 2B:
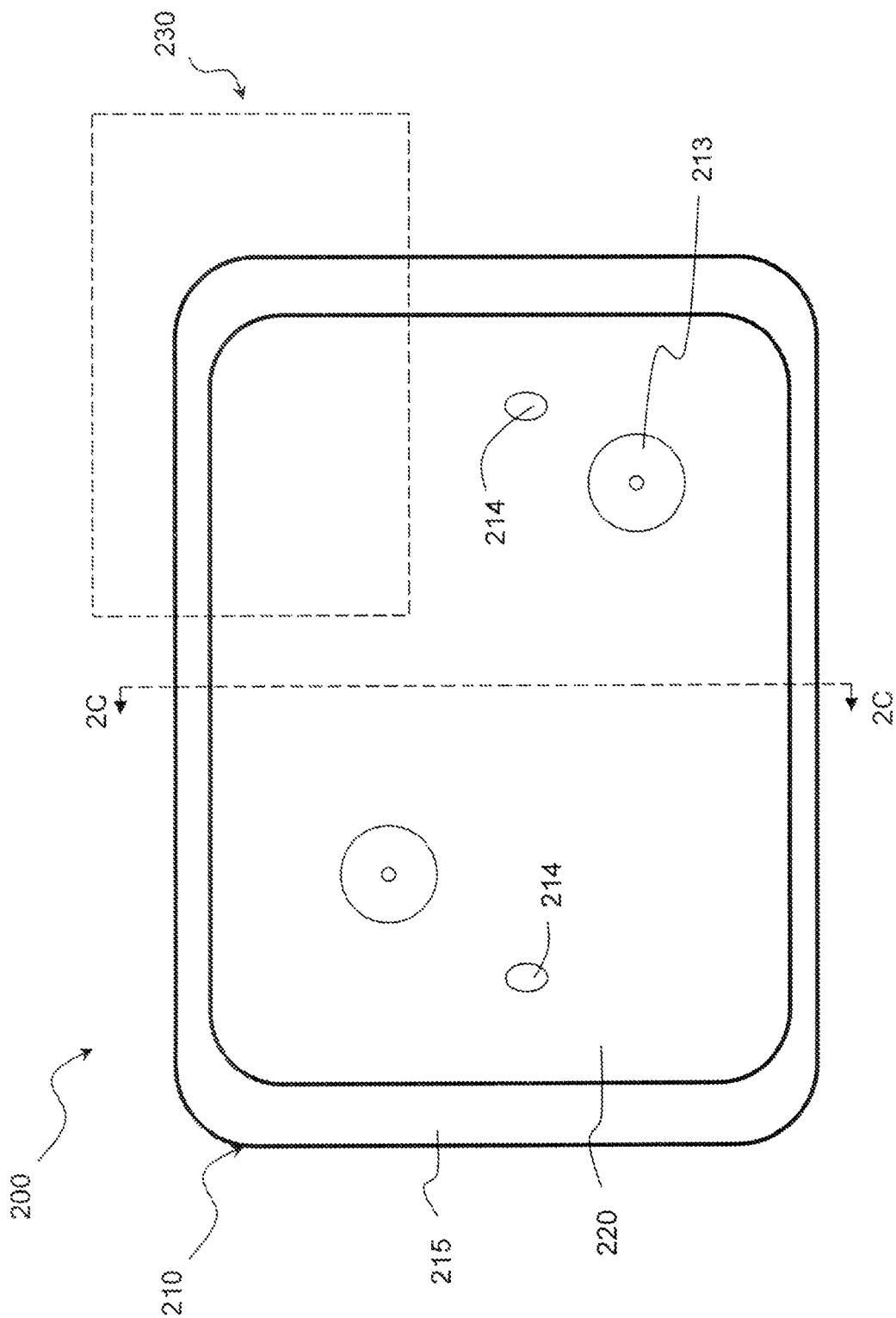
FIG. 2B is a schematic front view of an exemplary front-opening unified pod (FOUP).

FIG. 2B is a schematic front view of an exemplary front-opening unified pod (FOUP).

An apparatus 200 such as a front opening unified pod (FOUP) for accommodating at least one substrate 203 (shown in FIG. 2A) may include, for example, the enclosure 210 and a door 220. Referring to FIG. 2B, the enclosure 210 includes an opening 217 (not shown in FIG. 2B, but shown in FIG. 2D) and a frame 215 around the opening 217. The door 220 is movably configured to close the opening 217 of the enclosure 210. In some embodiments, the door 220 may include at least one registration pin such as registration pins 213 and at least one key slot such as key slots 214. The registration pins 213 are configured to locate a door-opening mechanism (not shown). In some embodiments, the key slots 214 are configured to be in mechanical communication with a pair of latch keys (not shown) on an inner side of the door 220.

The latch keys may be configured to lock or unlock the door 220 from the enclosure 210 by rotation of the key slots 214.

FIG. 2C is a schematic cross-sectional view of the exemplary FOUP taken along section line 2C-2C of FIG. 2B.

Referring to FIG. 2C, the door 220 seals the opening 217 (shown in FIG. 2D) by urging a sealing material 250 such as O-ring, plastic material, elastic material, rubber, polymer material, other material that is capable of substantially preventing gas penetration and/or diffusion or combinations thereof, into a groove 216 of the frame 215. Sealing material 250 is thereby retractably received within the groove 216. The groove 216 may fully or partially extend around the frame 215. The door 220 may include, for example, plates 221 and 223. The plate 221 faces the enclosure 210 and the plate 223 is opposite to the plate 221 and faces away from the enclosure 210. In some embodiments, the groove 216 is entrenched into a surface of the frame 215 which faces edges 220a of the door 220.

FIG. 2D is a schematic cross-sectional view similar to FIG. 2C but showing door 220 removed from the enclosure 210 to clearly illustrate opening 217. Through the opening 217, the substrate 203 (shown in FIG. 2A) can be delivered into or from the enclosure 210.

Figures 3A, 3B:
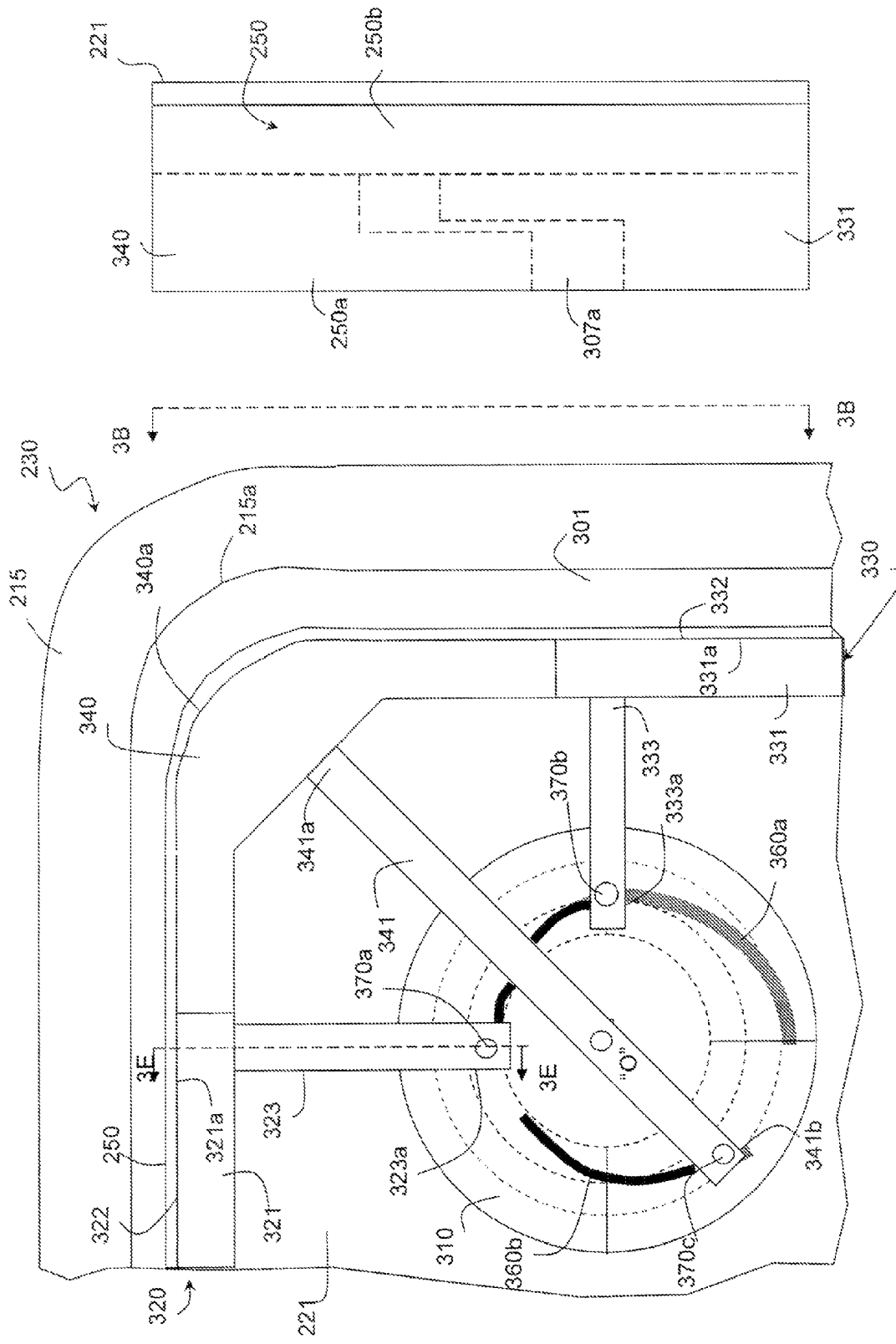
FIG. 3A is a schematic expanded drawing of area 230 of FIG. 2B when the door is not configured to seal the enclosure.
FIG. 3B is a schematic side view of the door of FIG. 3A taken along line 3B-3B of FIG. 3A.

FIG. 3A is a schematic expanded view showing further details of area 230 of FIG. 2B when the door 220 is not configured to seal the enclosure 210, i.e., gap 301 exists between frame 215 and sealing material 250 of door 220. In FIG. 3A, the showing of the plate 223 is omitted. Plate 213 may cover the portions of door 220 shown in FIG. 3A in some embodiments.

Figure 3H:
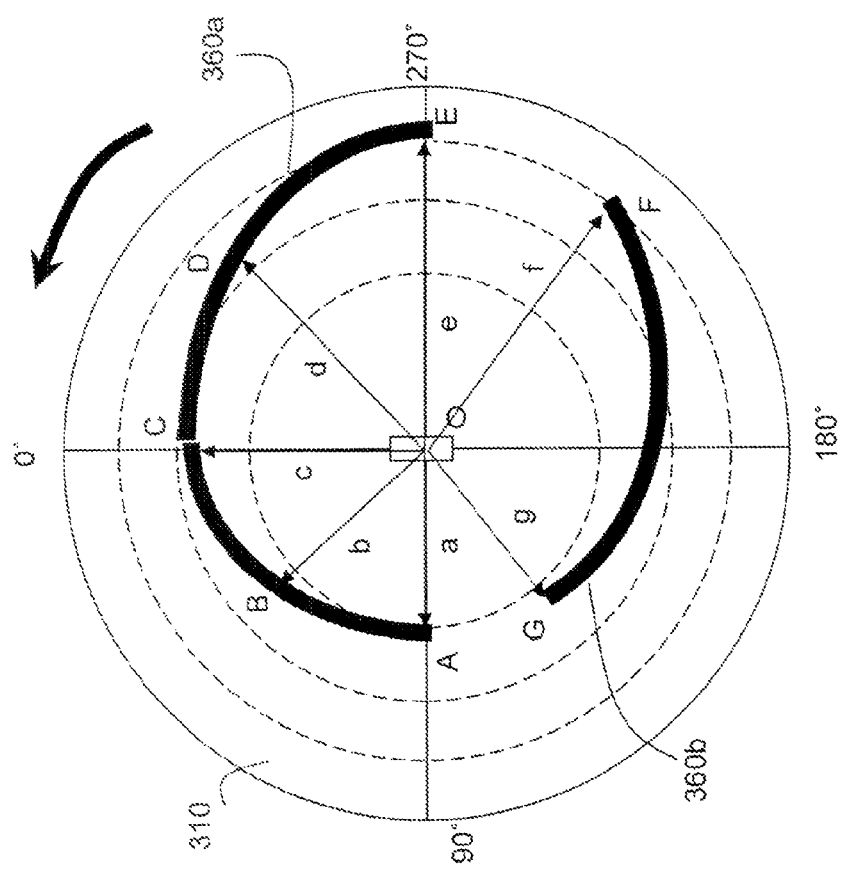
FIG. 3H is a schematic drawing of the rotational apparatus of FIG. 3G rotated by 90°.
Figure 3G:
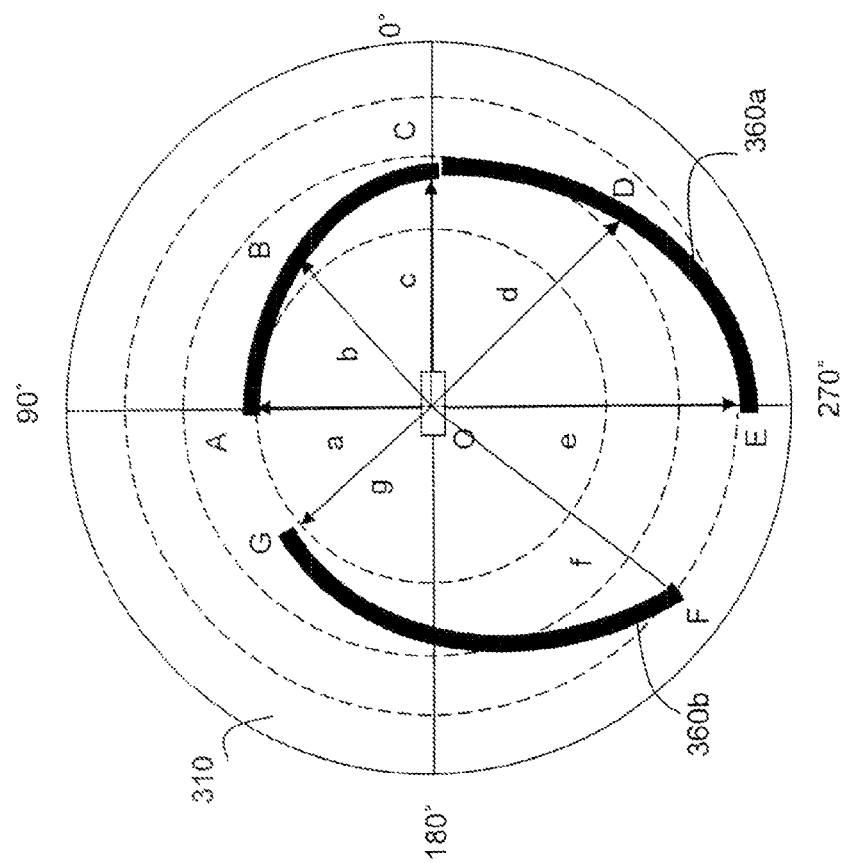
FIG. 3G is a schematic drawing of an exemplary rotational apparatus with grooves.

Referring to FIG. 3A, a rotational apparatus 310 is disposed over the plate 221. The rotational apparatus 310 may comprise, for example, at least one of a disc, gear, pinion, belt, other rotational device or combinations thereof. In some embodiments, the rotational apparatus 310 may have at least one groove such as grooves 360a and 360b. Each of the grooves 360a, 360b may be shaped such that the distance from the groove 360a or 360b to the center "O" of the rotational apparatus 310 such as a disc, vary with polar angles of the rotational apparatus 310. For example, as shown in FIG. 3G the groove 360a spirally extends from 90° to 270° through the points A, B, C, D and E. The radial distances a, b, c, d and e from the points A, B, C, D and E to the center O, respectively, gradually increase when the rotational degrees change from 90°, 45°, 0°, 315° and 270°, respectively.

Referring again to FIG. 3A, the door 200 includes at least one member 320 having a rib 321 and an arm 323. The arm 323 extends from the rib 321 and is connected to the rotational apparatus 310. In some embodiments, the rib 321 and the arm 323 may be vertically movably configured to the groove 360a at the end region 323a of the arm 323 via a pin 370a in the illustrated orientation, for example. The door 220 may comprise at least one member 330 having a rib 331 and an arm 333. The arm 333 extends from the rib 331 and is connected to the rotational apparatus 310. The rib 331 and the arm 333 may be horizontally movable within the groove 360a by connection via pin 370b coupled to the end region 333a of the arm 333 and which is received within groove 360a, for example. When rotational apparatus 310 is rotated, the arm 323 moves vertically and the arm 333 moves horizontally with respect to the illustrated orientation, i.e., the arms move in perpendicular directions.

Referring again to FIG. 3A, the door 200 may comprise at least one corner member 340. The corner member 340 may have an edge 340a having a shape corresponding to the shape of the corner 215a of the frame 215. The corner member 340 may be, for example, connected to an end 341a of an arm 341. Another end 341b of the arm 341 may be connected to the rotational apparatus 310. In some embodiments, the corner member 340 and the arm 341 are movably coupled to rotational apparatus 310 via a pin 370c received in groove 360b such that arm 341 moves in the direction corresponding to the corner 215a of the frame 215 when rotational apparatus 310 rotates. In some embodiments, the corner member 340 may be omitted if the cooperation of the ribs 321 and 331 may desirably seal the enclosure 210 (shown in FIG. 2C).

The door 220 may also comprise at least one sealing material 250. The sealing material 250 is disposed along a longitudinal side 321a of the rib 321, the outer edge 340a of the corner member 340 and a longitudinal side 331a of the rib 331.

In some embodiments, the sealing material 250 may be fixed to at least one region 341 of the edge 340a of the corner member 340 via, for example, a pin or glue (not shown). The sealing material 250 is fixed to the region 341 such that the sealing material 250 does not disconnect from the edge 340a of the corner member 340 during the operating of sealing/unsealing the enclosure 210 (shown in FIGS. 2C and 2D). In other embodiments, the sealing material 250 may be fixed to more than one region of edge 340a of arm 341 of the corner member 340. In some embodiments, the sealing material 250 may be fixed to at least one region 322 of the edge 321a of the rib 321 and/or at least one region 332 of the edge 331a of the rib 331 via, for example, a pin or glue (not shown).

Still referring to FIG. 3A, a gap 301 is formed between the frame 215 and the door 220 when the door 200 is not configured to seal the enclosure 210 (shown in FIG. 2D).

FIG. 3B is a schematic side view of the door 220 of FIG. 3A along the direction of the line labeled 3B-3B. Referring to FIG. 3B, the sealing material 250 may comprise sealing material regions 250a and 250b. The sealing material region 250a is disposed at the edges 321a, 340a and 331a and may be an O-ring or similar member. The dashed lines indicate the shapes of the corner member 340 and the rib 331, which are disposed behind the sealing material 250 which is forward in the illustrated orientation, i.e., covering corner member 340 and the rib 331. In some embodiments, a gap 307a exists between the corner member 340 and the rib 331.

FIG. 3E is a schematic cross-sectional view of the door 220 taken along section line 3E-3E of FIG. 3A. When the door 220 is not disposed to seal the enclosure 210 (shown in FIG. 2D), the sealing material region 250b is loose. In some embodiments, the sealing material region 250b may be a strip sealing material which continuously connects the edge 221a of the plate 221 to the side 321a of the rib 321 and the edge 340a of the corner member 340 to the side 331a of the rib 331. The sealing material region 250b may be coupled to the sealing material region 250a in some embodiments.

FIG. 3C is a schematic drawing of the structure of FIG. 3A after the rotational apparatus 310 is rotated 90°-counterclockwise with respect to the illustration of FIG. 3A such that the door 220 is configured to seal the enclosure 210. The plate 223 is not shown. FIG. 3H is a schematic drawing of the rotational apparatus 310 after a 90°-counterclockwise rotation with respect to the orientation shown in FIG. 3G.

Referring to FIG. 3H, after the 90°-counterclockwise rotation of the rotational apparatus 310, the pin 370a (shown in FIG. 3A or 3C) configured to the groove 360a is moved by a distance c-a. Since the distance "c" is larger than the distance "a", the arm 323 connected to the rib 321 is upwardly transferred by substantially a distance c-a by the 90° rotation of the rotational apparatus 310 as shown in FIG. 3C. Under the same situation, the pin 370b (shown in FIG. 3A or 3C) configured to the groove 360a is moved by a distance e-c and the arm 333 connected to the rib 331 is horizontally transferred by substantially a distance e-c. Also, the pin 370c (shown in FIG. 3A or 3C) configured to the groove 360b is moved by a distance f-g and the arm 341 (shown in FIG. 3C) movably configured to the groove 360b is transferred along the direction of the arrow X by substantially a distance f-g. The movements of the arms 323, 333, 341 seal the door 220 and the frame 215, and the gap 301 previously shown in FIG. 3A, is closed FIG. 3D is a schematic side view of the door 220 of FIG. 3C along the direction of the line labeled 3D-3D. Since the ribs 321, 331 and corner member 340 are outwardly transferred, a gap 337b between the corner member 340 and the rib 331 is larger than the gap 337a shown in FIG. 3B, i.e. corner member 340 and the rib 331 are spaced further apart than in FIG. 3A.

FIG. 3F is a schematic cross sectional view of the door 220 taken along section line 3F-3F of FIG. 3C. When the door 220 is configured to seal the enclosure 210 (shown in FIG. 2C), the sealing material region 250a is moved into the groove 216 of the frame 215 (shown in FIG. 2C). The sealing material region 250b is tightened due to the upward movement of the rib 321 and the arm 323 as shown in FIG. 3F. The sealing material 250 may further tightly seal the enclosure 210 if the pressure within the sealed enclosure 210 is higher than that of atmosphere. The pressure difference between the sealed enclosure 210 and atmosphere further forced the sealing material region 250a tightly against the walls of the groove 216. The sealing material region 250b is formed of a material that advantageously prevents diffusion of gas such as inert gas, reduction gas, nitrogen or combinations thereof from the enclosure 210 to atmosphere.

In some embodiments, two ribs 321 are separately configured at the top region and bottom region of the door 220; two ribs 331 are separately configured at the left side and right side of the door 220; and four corner members 341 are separately configured at each corner region of the door 220. In other embodiments, each side of the door 220 may have more than one rib such that the rib(s) desirably transfer the sealing material layer region 250a into the groove 216 of the frame 215 (shown in FIG. 2C). In some embodiments, only one groove 460 (such as shown in FIG. 4) is formed on the rotational apparatus 415 to outwardly or inwardly transfer the arms 423, 433 and 441 when the rotational apparatus 415 is rotated.

Referring to FIGS. 2C, 3C and 3F, when the rotational apparatus 310 is rotated to seal the enclosure 210, the ribs 321, 331 and the corner member 340 are outwardly transferred to the frame 215. In turn, the sealing material region 250a is moved into the groove 216. In some embodiments, since the sealing material region 250a may substantially vertically transferred into the groove 216, a horizontal force resulting from the pressure difference between atmosphere and the sealed FOUP 200 may further push the sealing material region 250 against the walls of the groove 216. Accordingly, the enclosure 210 can be further tightly sealed.

Further, the taut sealing material region 250b (shown in FIG. 3F) connects the edge 321a of the rib 321 and the edge 221a of the plate 221. The pulled sealing material region 250b may continuously extend along the edges of the door 220, desirably sealing the enclosure 210. Accordingly, the taut sealing material region 250b prevents gas diffusion and/or distribution between the space in the enclosure 210 and atmosphere. By using the sealing material 250, a desired moisture percentage control within the enclosure 210 (shown in FIG. 2C) can be achieved.

Figure 4:
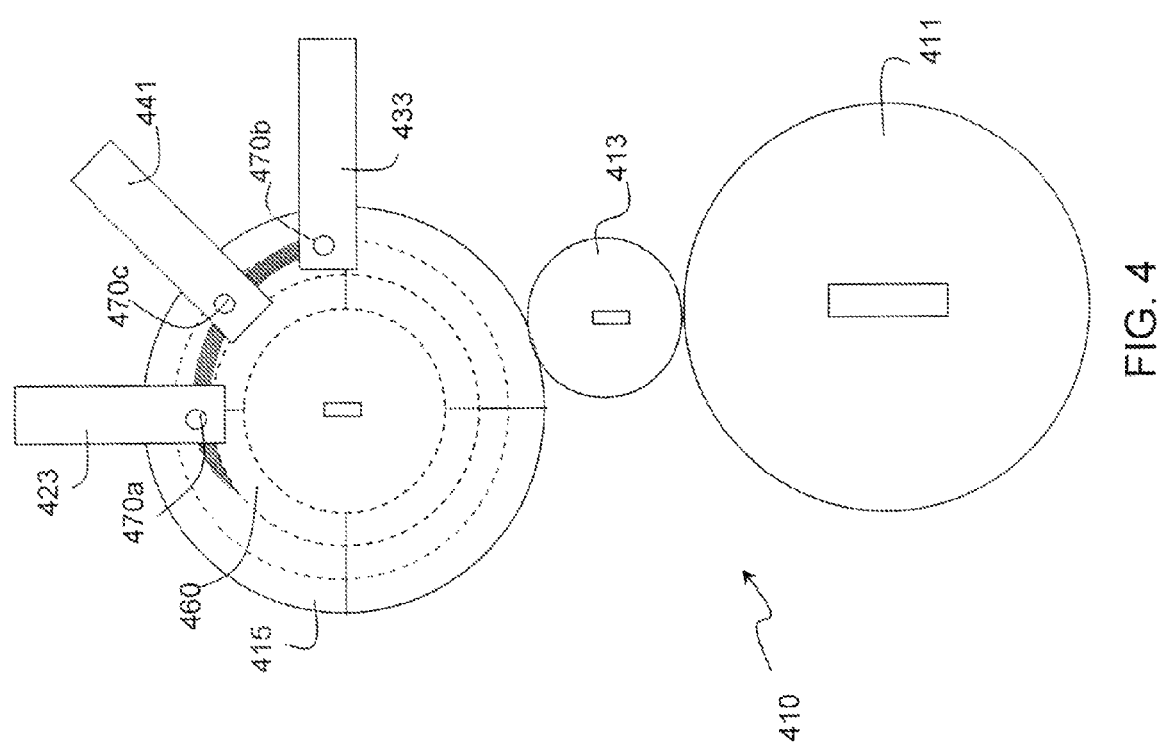
FIG. 4 is a schematic drawing showing an exemplary rotational apparatus.

FIG. 4 is a schematic drawing showing an exemplary rotational apparatus.

Referring again to FIG. 4, arms 423, 433, 441, pins 470a-470c and groove 460 is similar to arms 323, 333, 341, pins 370a-370c and groove 360a, respectively. Detailed descriptions of these elements are not repeated. The rotational apparatus 410 may comprise, for example, gears 413 and 415, which are engaged. A key slot 411 may be configured to and engaged with the gear 413.

When the key slot 411 is rotated to seal or unseal the enclosure 210 (shown in FIG. 2B), the key slot 411 rotates the gear 413, which in turn rotates the gear 415. The rotated gear 415 transfers the arms 423, 441 and 433 inwardly or outwardly so as to unseal or seal the enclosure 210, respectively.

In some embodiments, the key slot 411 may be directly engaged with the gear 415 so as to rotate the gear 415. In some embodiments, the rotational apparatus 410 may comprise at least one disc and belt (not shown) by which the rotation of the key slot 411 moves the belt such that the belt rotates the disc. In other embodiments, one end of a connecting member (not shown) is disposed to the gear 415 and another end of the connecting member is disposed to the key slot 411. The connecting member may be, for example, an arbor, axis, gudgeon, mandrel, pin, pivot, pole, rod, shaft, spindle, stalk, stem or support. When the key slot 411 is rotated, the connecting member will be operative to rotate the gear 415.

The rotational apparatus 410 and 410, however, are not limited to the exemplary embodiments set forth above in connection with FIGS. 3A, 3C and 4. Based on the exemplary embodiments, one of ordinary skill in the art may assemble an apparatus to transfer and/or move the sealing material 250 into the groove 216 of the frame 215 (shown in FIG. 2C) so as to desirably seal the enclosure 210.

Figure 6D:
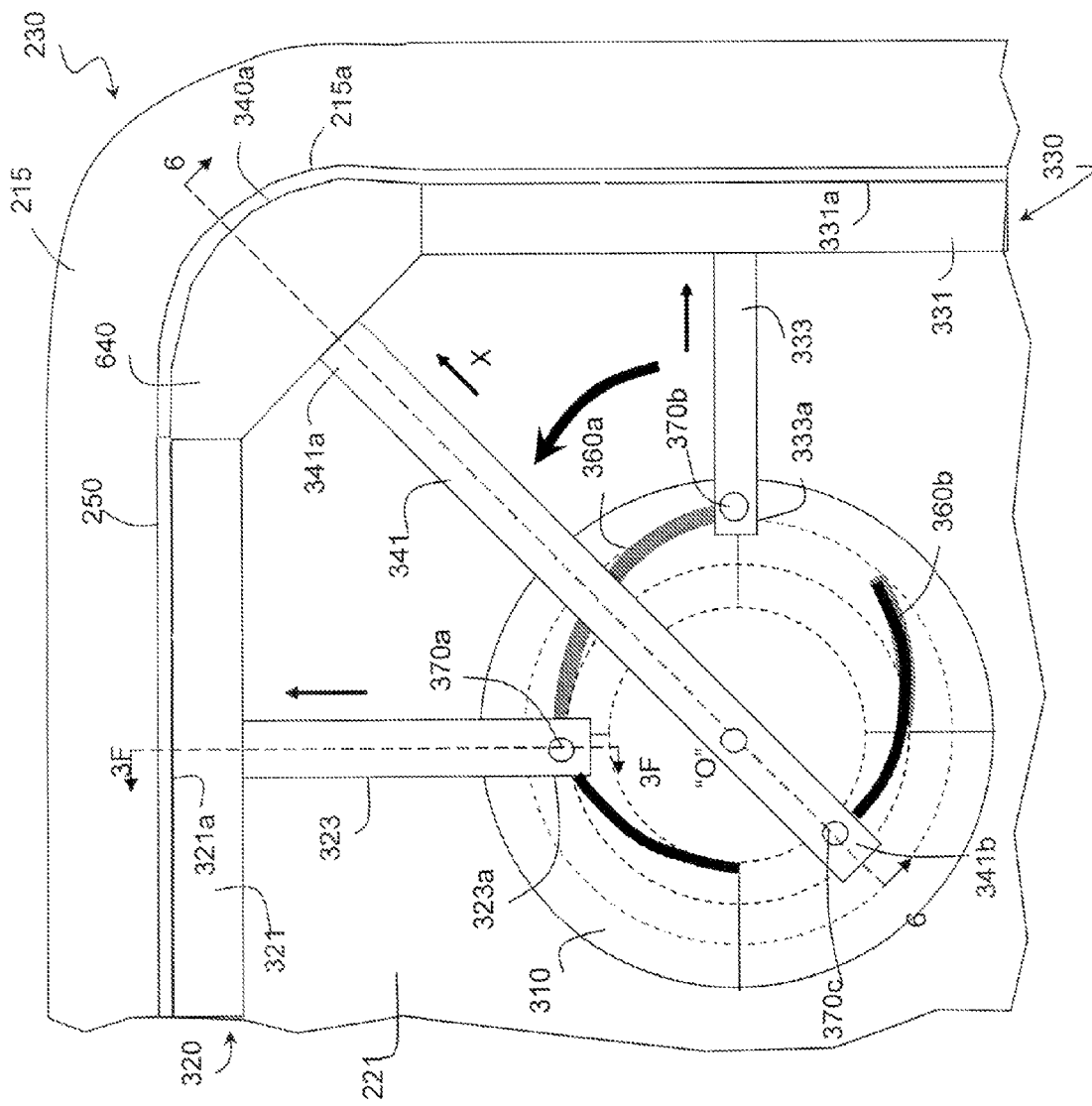
FIG. 6D is a schematic drawing of an exemplary rotational apparatus with grooves.

FIGS. 6A-6C are schematic cross-sectional views showing operation of another exemplary corner member and arm taken along section line 6-6 of FIG. 6D; and FIG. 6D is a schematic drawing of an exemplary rotational apparatus with grooves.

Like items of FIGS. 6A-6D are indicated by reference numerals having the same value as in FIG. 3C. In some embodiments such as illustrated in FIGS. 6A-6C, the operation of the corner member 340 and the arm 341 may be as described below.

Referring to FIG. 6A, corner member 640 may include body 605 and be connected to the arm 341 via a pivot 610. In some embodiments, the body 605 of the corner member 640 may include an edge 620, which is configured to contact and slide against the plate 223. The body 605 of the corner member 640 may be substantially horizontally disposed according to the orientation presented in FIGS. 6A-6C when the door 220 is not configured to seal the enclosure 210 (shown in FIG. 2D).

Referring to FIG. 6B, when the rotational apparatus 310 is rotated to move the arm 341 upward, the body 605 of the corner member 640 is also upwardly transferred by pivoting about the pivot 621. The arm 341 transfers the body 605 of the corner member 640 to an more upward position as the end 620 of the corner member 640 slides along the plate 223 as the body 605 pivots about the pivot 621. Referring to FIGS. 2C and 6C, the rotational apparatus 310 is rotated with a predetermined angle to seal the enclosure 210 with the door 220. With the rotation of the rotational apparatus 310, the pin 370a is moved to a predetermined location and the arm 341 is upwardly transferred causing the body 605 to pivot upwardly such that the sealing material region 250a is moved into the groove 216. Also, the sealing material region 250b is pulled to desirably seal the enclosure 210.

Figure 7:
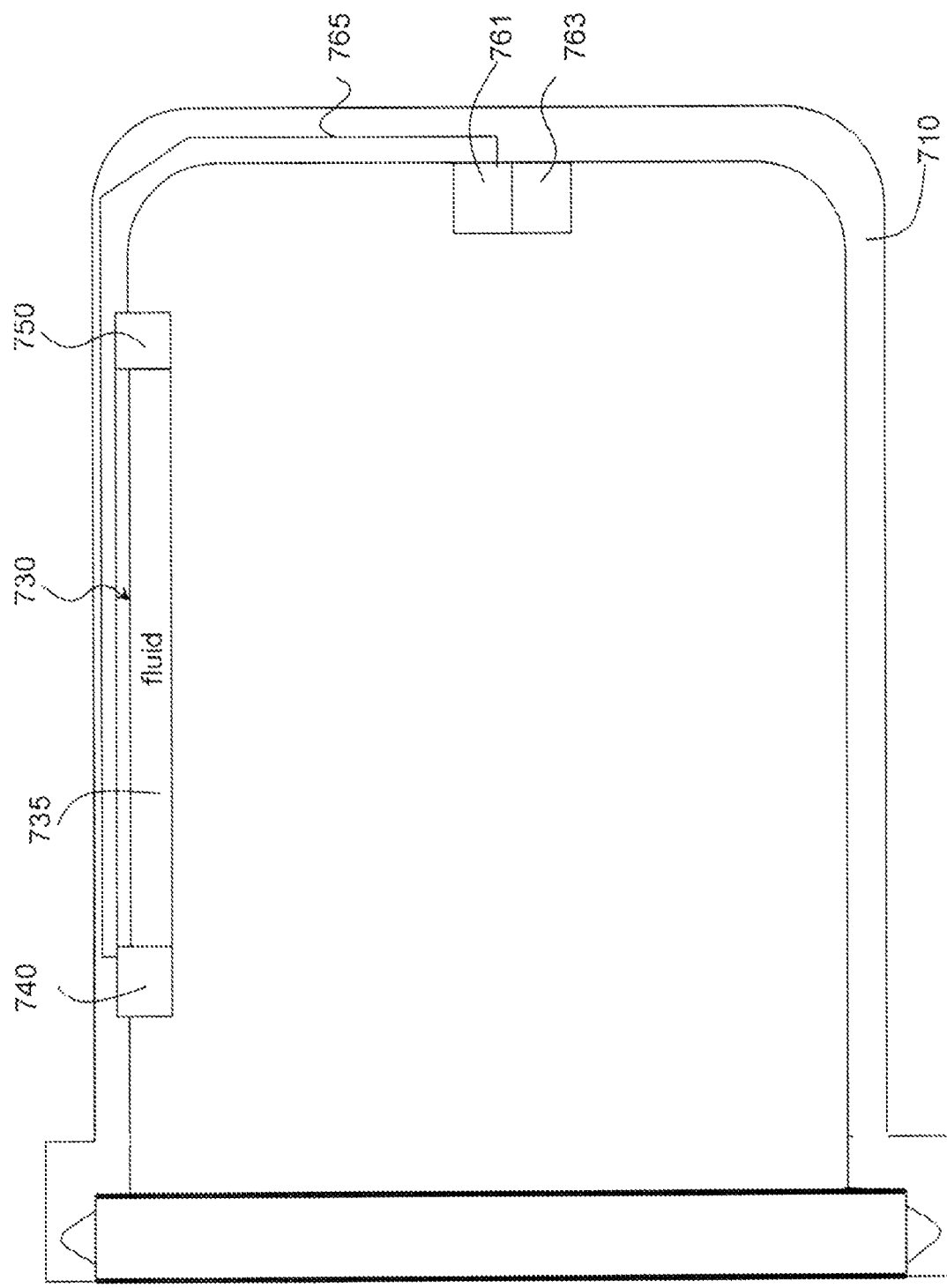
FIG. 7 is a schematic cross-sectional view showing another exemplary FOUP.

FIG. 7 is a schematic cross-sectional view showing an exemplary FOUP.

In some embodiments, the enclosure 210 may include a cabinet 730 disposed at the top of the enclosure 210. The cabinet 730 may contain fluid 735 and include, for example, valves 740 and 750. The enclosure may also include a device 761 such as a pressure gauge, an oxygen gauge or a moisture meter and a release valve 763 disposed on the sidewall of the enclosure 210. The device 761 is coupled to the cabinet 730 through the connection 765. The cabinet 730, valves 740, 750, fluid 735, release valve 763 and connection 765 are similar to the cabinet 230, valves 240, 250, fluid 235, release valve 263 and connection 265 as set forth in Applicants' copending U.S. patent application Ser. No. 11/419,914, filed on May 23, 2006.

In some embodiments, the device 761 is coupled to the valve 740 by the connection 765 to send a signal to trigger the valve 740 to release the reduction fluid gas from the cabinet 730. In some embodiments, the device 761 may be a pressure gauge and the pressure gauge may trigger the signal if the internal pressure of the FOUP is about 1.05 atmospheres or less. The release valve 763 is adapted to adjust the pressure within the FOUP when the pressure within the FOUP is higher than a desired pressure limit, such as about 2.5 atm. Adjusting the pressure within the FOUP can prevent potential explosions resulting from a volatile reduction gas within the FOUP as described above. In some embodiments, the pressure gauge 761 senses the pressures within and outside the FOUP. If the pressure within the FOUP is higher than the pressure outside the FOUP by a certain amount, the pressure gauge 761 sends a signal to the release valve 763 to trigger release of at least some of gas within the FOUP.

In other embodiments, the device 761 may be an oxygen gauge and the oxygen gauge may trigger the signal if the oxygen level within the FOUP is about 500 parts per million (ppm) or more. In still other embodiments, the device 761 may be a moisture meter and the moisture meter may trigger the signal if the moisture level within the FOUP is about 0.1% relative humidity (R.H.) or more.

FIG. 8A is a schematic cross-sectional view of an exemplary FOUP which comprises a door and an enclosure, wherein the door does not seal the enclosure in the illustrated embodiment.

Referring to FIG. 8A, the carrier 800 comprises an enclosure 810 comprising a door 820 for opening and closing the enclosure 810. The enclosure 810 may comprise a frame 815 to which the door 820 is configured to seal the enclosure 810. At least one sealant material 830 may be disposed on the surface 815a of the frame 815. In some embodiments, the carrier 800 may be as described in, for example, commonly assigned and copending U.S. patent application Ser. No. 11/419,914, filed on May 23, 2006, the entirety of which is hereby incorporated by reference herein.

In some embodiments, the sealant apparatus 830 may be disposed around the opening (not labeled) of the enclosure 810, along the shape of the frame 815. In some embodiments, the sealant apparatus 830 may have a dimension "t" between about 2 millimeter (mm) and about 5 mm.

The sealant apparatus 830 may comprise a material having a hardness of about 10 Shore A or less. In some embodiments, the material of the sealant apparatus 830 may comprise vinyl-functional polysiloxane, a fumed silica and platinum compound. One preferred material of the sealant apparatus 830 is silicone rubber GS-884A, GS-861 or GS-888A available from General Silicones Co., Ltd., Hsinchu, Taiwan. The sealant apparatus 830 may advantageously formed of a resiliently deformable material.

The material of the sealant apparatus 830 may have a tensile strength between about 25 kg/cm$^2$ and about 29 kg/cm$^2$. In some embodiments, the material of the sealant apparatus 830 may have a tear strength between about 11 kg/cm and about 15 kg/cm. In other embodiments, the material of the sealant apparatus 830 may have an elongation between about 250% and about 410%.

Figure 8B:
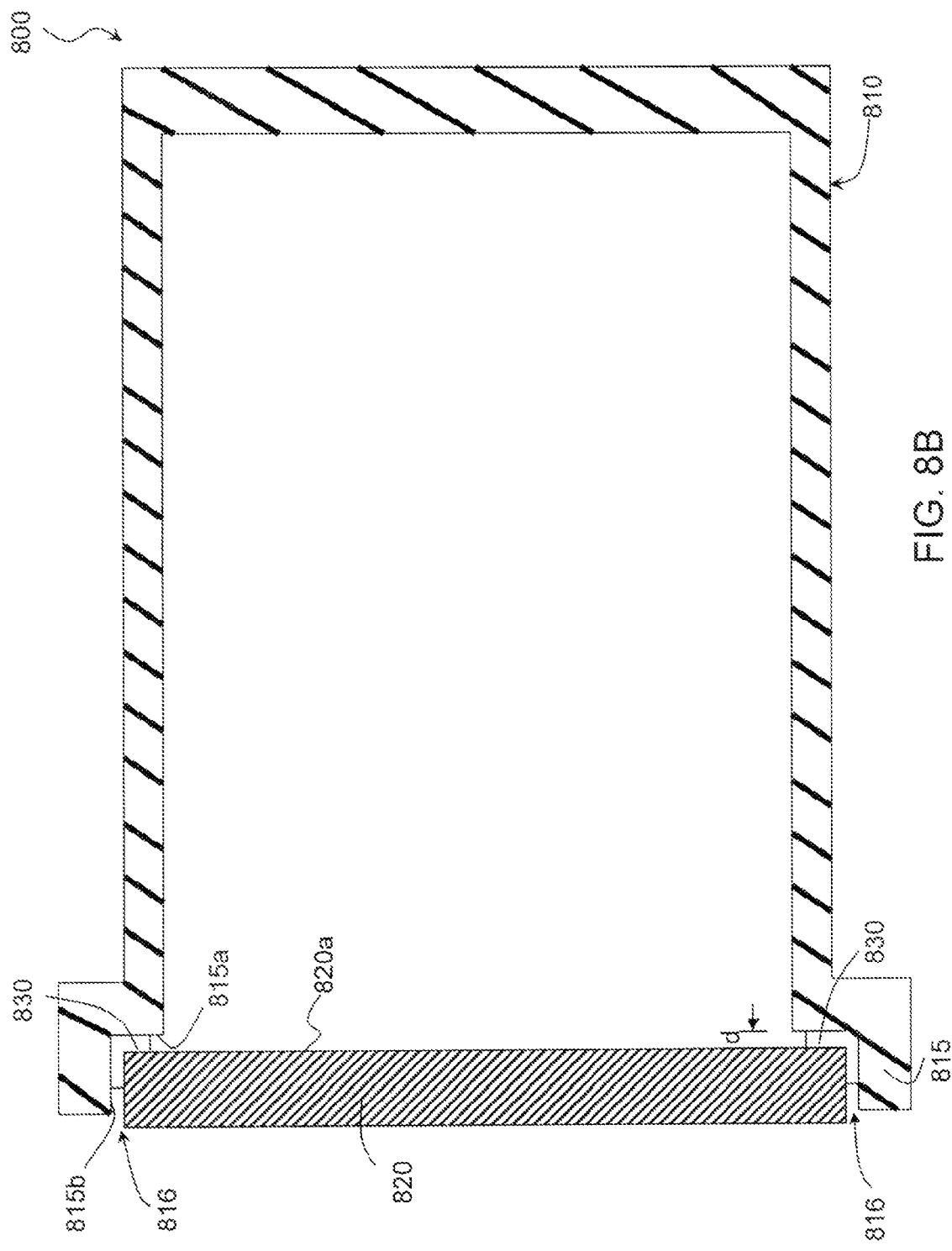
FIG. 8B is a schematic cross-sectional view of an example FOUP with a door sealing an enclosure.

FIG. 8B is a schematic cross-sectional view of the exemplary FOUP of FIG. 8A, but in which the door 820 seals the enclosure.

Referring to FIG. 8B, the door 820 is disposed to seal the enclosure 810. The surface 820a of the door 820 is against the sealant apparatus 830 and compresses the sealant apparatus 830. Due to its desired hardness and/or elongation, the sealant apparatus 830 can be desirably deformed and its length along surface 815 extended. For example, the sealant apparatus 830 may extend from the surface 815a to the surface 815b so as to desirably seal the gap 816 when subjected to a pressure or force applied from the door 820. In some embodiments, the gap 816 may have a distance "d" about between about 1 mm and about 3 mm. The compressive pressure or force from the door 820 will press the sealant apparatus 830 so as to compress the deformable sealant apparatus 830 and extend the sealant apparatus 830 along the gap 816 between the door 820 and the frame 815. The resiliently deformable sealant apparatus 830 will desirably return to its original shape illustrated in FIG. 8A, when the door 820 is removed from the sealing enclosure 810.

The compressed sealant apparatus 830 shown in FIG. 8B may be densified after the door 820 is transferred to seal the opening (not labeled) of the enclosure 810. The compressed sealant apparatus 830 may desirably seal the enclosure 810 such that gas (not shown) in the enclosure 810 does not diffuse or leak through the gap 816.

In some embodiments, the sealant apparatus 830 may be disposed on either or both surfaces 820a and 815a as long as the compressed sealant apparatus 830 may desirably seal the enclosure 810 when the door 820 is configured to seal the enclosure 810.

Figure 8C:
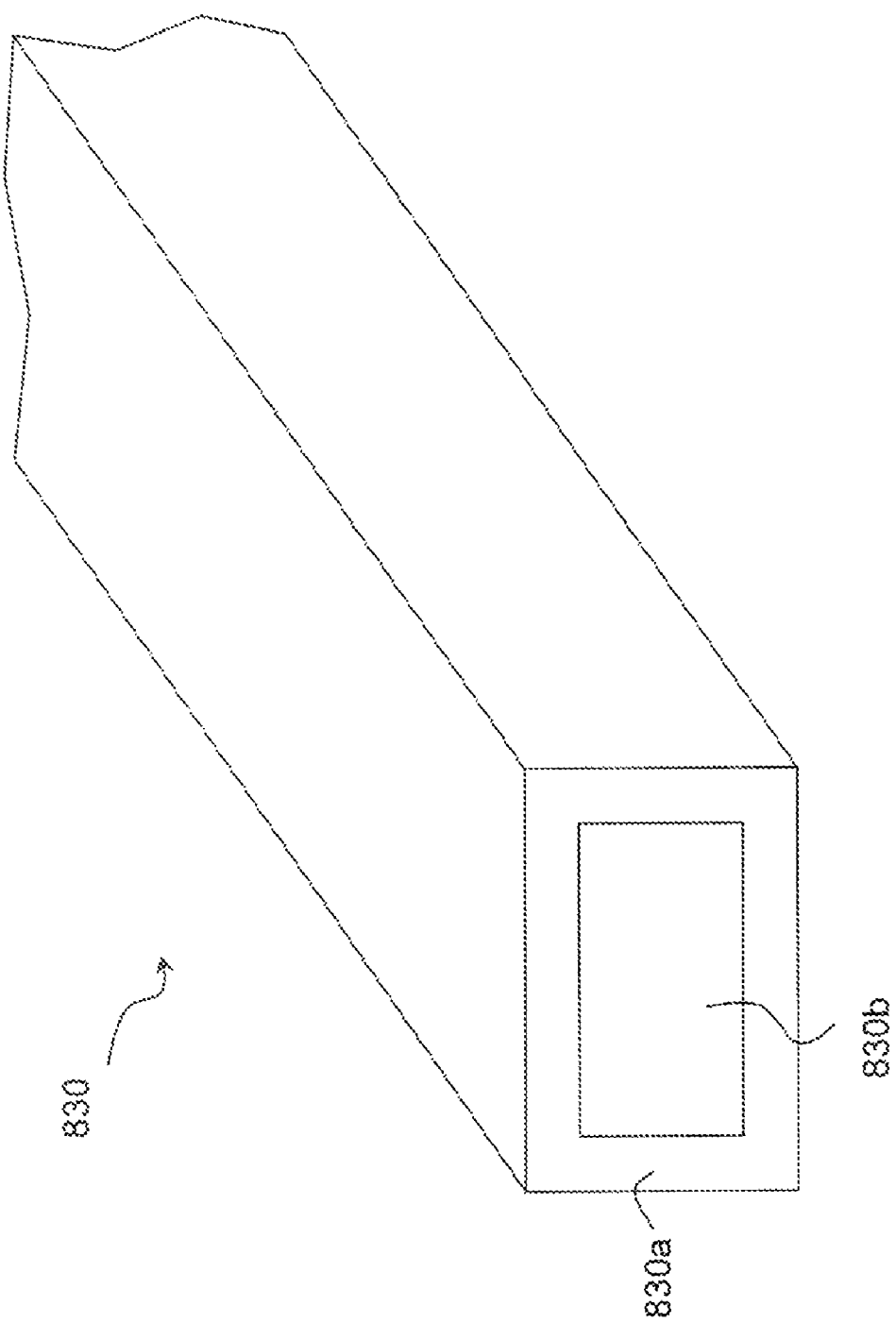
FIG. 8C is a perspective drawing showing an exemplary sealant apparatus.

FIG. 8C is a perspective drawing showing an exemplary sealant apparatus.

Referring to FIG. 8C, the sealant apparatus 830 may comprise, for example, regions 830a and 830b. The cross-section of the sealant apparatus 830 may be a circle, oval, triangle, square, rectangle, hexagon, octagon, or other shape.

In some embodiments, the sealant apparatus 830 may comprise a hollow strip, i.e., the region 830a may be a material described above in connection with FIG. 8A and the region 830b may represent a hollow space. In some embodiments, a fluid such as a gas and/or liquid is filled within the region 830b.

In some embodiments, the region 830a represents a sealant material and the region 830b represents another sealant material. The sealant materials of the regions 830a and 830b may be similar to the material described above in connection with FIG. 8A. In some embodiments, the sealant material of the region 830a may have a hardness larger than that of the region 830b.

In some embodiments, the sealant apparatus 830 may be incorporated with the apparatus (shown in FIGS. 3A-3H, 4 and 6A-6D) or replace the sealing material 250 (shown in FIG. 3A) for sealing the enclosure 210 (shown in FIG. 2D).

FIG. 9A is a schematic cross-sectional view showing an exemplary FOUP.

Referring to FIG. 9A, the FOUP 900 may include an enclosure 910 and a door 920. The enclosure 910 includes an opening (not shown) which is similar to the opening 217 shown in FIG. 2D. The enclosure 910 may include a frame 915 around the opening. The frame 915 may include a groove 916 that receives a sealant apparatus 905 disposed at an edge of the door 920. The door 920 may include a plate 921 facing the enclosure 910. The door 920 is configured to seal the opening (not shown) by urging the sealant apparatus 905 into the groove 916 of the frame 915. In some embodiments, the enclosure 910, the frame 915, the groove 916 and the plate 921 are similar to the enclosure 210, the frame 215, the groove 216 and the plate 221 described above in connection with FIG. 2C.

Figure 9C:
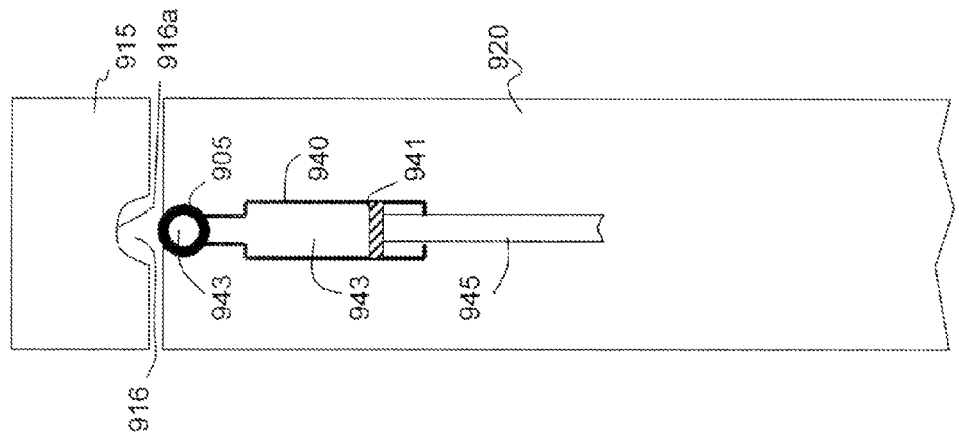
FIG. 9C is a schematic cross sectional view of the FOUP of FIG. 9B, taken along a section line 9C-9C.
Figure 9B:
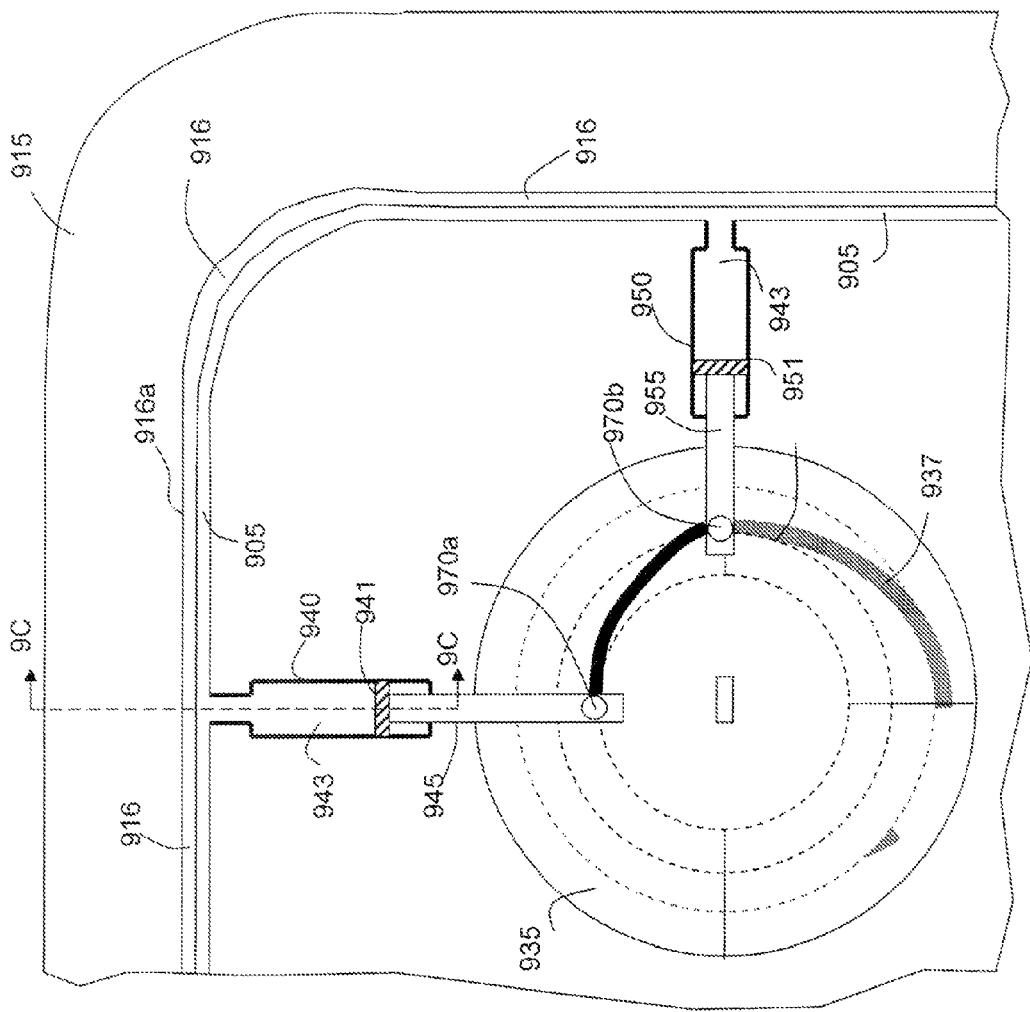
FIG. 9B is a schematic front view showing a portion of an exemplary FOUP of FIG. 9A when the door does not seal the enclosure.

FIG. 9B is a schematic front view showing a portion of an exemplary FOUP of FIG. 9A when the door does not seal the enclosure (i.e., sealant apparatus 905 does not contact top edge 916a), and FIG. 9C is a schematic cross sectional view of the FOUP of FIG. 9A, taken along a section line 9C-9C.

Referring to FIG. 9B, the door 920 may comprise the sealant apparatus 905 disposed at the edge (not labeled) of the door 920. The sealant apparatus 905 may have a structure similar to that of the sealant apparatus 830 (shown in FIG. 8C). In some embodiments, the sealant apparatus 905 may contain a fluid 943 such as water or gas (helium, argon, nitrogen or other gas) therein. A rotational apparatus 935 is rotatably disposed on the door 920. At least one body such as bodies 940, 950 is fluidly coupled to the sealant apparatus 905, i.e. the fluid 943 within the bodies 940, 950 may extend to within the sealant apparatus 905. At least one piston such as pistons 941, 951 may be disposed within the bodies 940, 950, respectively. At least one shaft such as shafts 945, 955 may be connected to the pistons 941, 951, respectively. The ends (not labeled) of the shafts 945, 955 may be connected to the rotational apparatus 935 by, for example, pins 970a, 970b, respectively. In some embodiments, the rotational apparatus 935 may comprise, for example, at least one groove 937 along which the shafts 945, 955 can travel when the rotational apparatus 935 is rotated. In some embodiments, the dispositions and the operations of the rotational apparatus 935, the groove 937, the pins 970a, 970b and the shafts 945, 955 may be similar to those of the rotational apparatus 310, the groove 360a, the pins 370a, 370b and the arms 323, 333 shown in FIG. 3A.

Referring to FIGS. 9B and 9C, a gap (not labeled) between the top edge 916a of the groove 916 and the sealant apparatus 905 presents, when the rotational apparatus 935 is not rotated to expand the sealant apparatus 905 to seal the opening (not shown) of the enclosure 910 (shown in FIG. 9A).

Figure 9E:
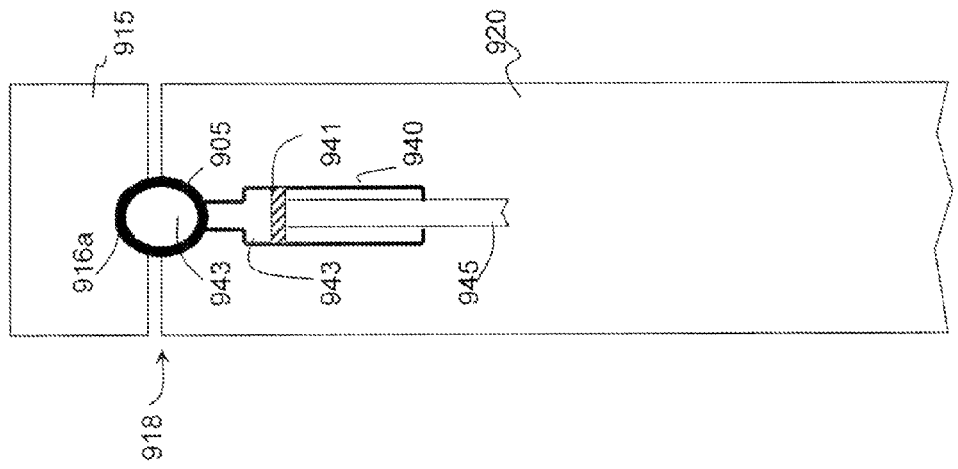
FIG. 9E is a schematic cross sectional view of the FOUP of FIG. 9D, taken along a section line 9E-9E.
Figure 9D:
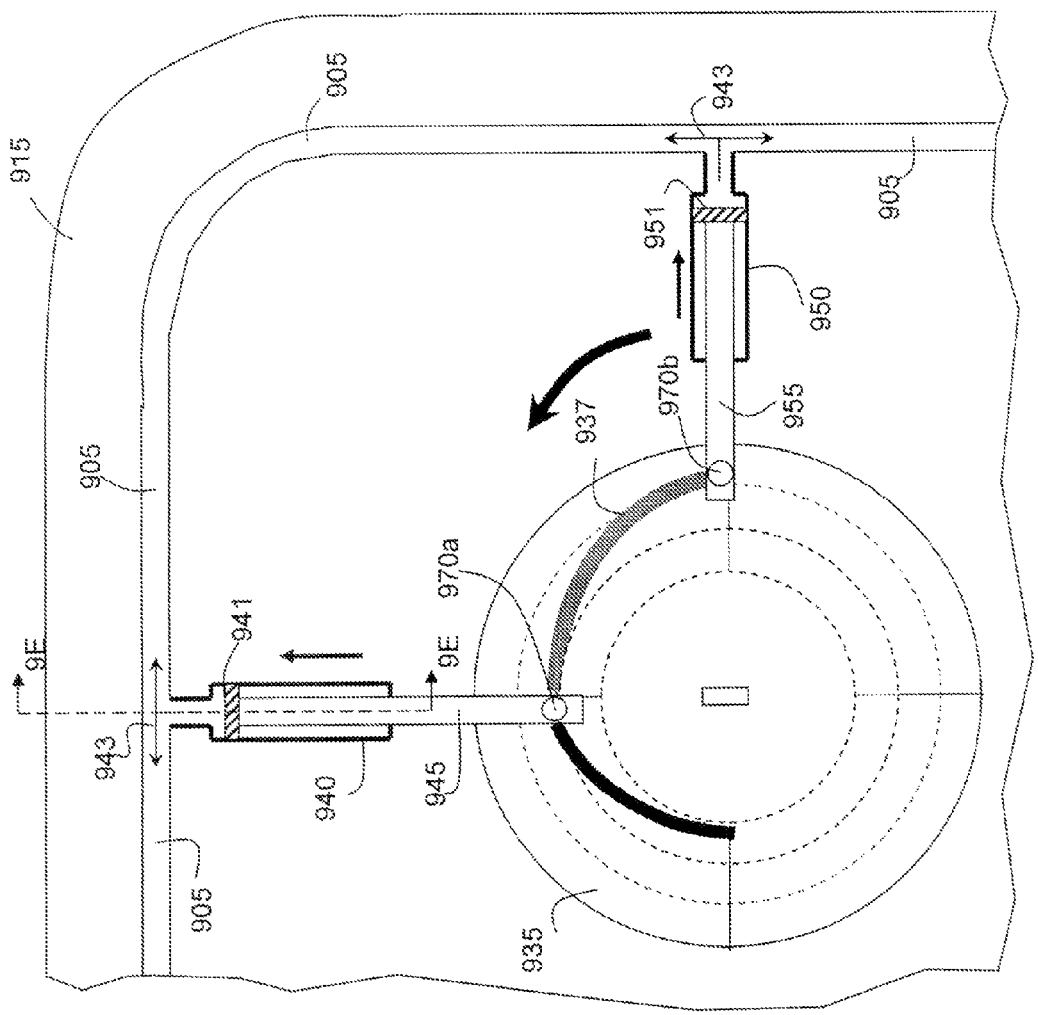
FIG. 9D is a schematic front view showing a portion of an exemplary FOUP of FIG. 9A when the door seals the enclosure.

FIG. 9D is a schematic front view showing a portion of an exemplary FOUP of FIG. 9A when the door seals the enclosure (i.e., sealant apparatus 905 contacts top edge 916a), and FIG. 9E is a schematic cross sectional view of the FOUP of FIG. 9A, taken along a section line 9E-9E.

Referring to FIG. 9D, the rotational apparatus 935 is counterclockwise rotated so as to transfer the shafts 945, 955 to seal the enclosure 910 (shown in FIG. 9A). In some embodiments, the operation and moving of the rotational apparatus 936 and the shafts 945, 955 may be similar to the rotational apparatus 310 and the arms 323 and 333 shown in FIGS. 3G and 3H. Accordingly, the shafts 945, 955 may be vertically and horizontally transferred, respectively. The movement of the shafts 945, 955 may push the respective pistons 941, 951 away from the rotational apparatus 935 so as to push the fluid 943 into the sealant apparatus 905. Due to the hardness and the elongation of the material of the sealant apparatus 905, the fluid 943 flowing into the sealant apparatus 905 may desirably expand or inflate the sealant apparatus 905 without breaking or damaging the sealant apparatus 905. The sealant apparatus 905 may be desirably inflated into the groove 916, desirably contacting the surface of the groove 916 or against the top edge 916a of the groove 916 as shown in FIG. 9E. Accordingly, the sealant apparatus 905 may desirably seal the gap 918 between the door 920 and the frame 915.

In some embodiments, the rotational apparatus 935 is clockwise rotated so as to transfer the shafts 945, 955 to unlock the enclosure 910 (shown in FIG. 9A). By clockwise rotating the rotational apparatus 935, the shafts 945, 955 may be vertically and horizontally transferred, respectively, inwardly toward the rotational apparatus 935. The moving of the shafts 945, 955 may pull the pistons 941, 951 toward the rotational apparatus 935 so as to drain the fluid 943 from the sealant apparatus 905 into the bodies 940, 950. Due to the reduced amount of the fluid 943 within the sealant apparatus 905, the sealant apparatus 905 may be desirably flattened. The gap (not labeled) between the top edge 916a of the groove 916 and the sealant apparatus 905 is produced as shown in FIG. 9C. Accordingly, the door 920 may desirably removed from the enclosure 910 so as to open the FOUP for transferring substrates.

In some embodiments, the sealant apparatus 905, the bodies 940, 950 and the pistons 941, 951 may incorporated with the apparatuses shown in FIGS. 3A-3H, 6A-6C and 5 so as to form a desired FOUP.

Figure 1B:
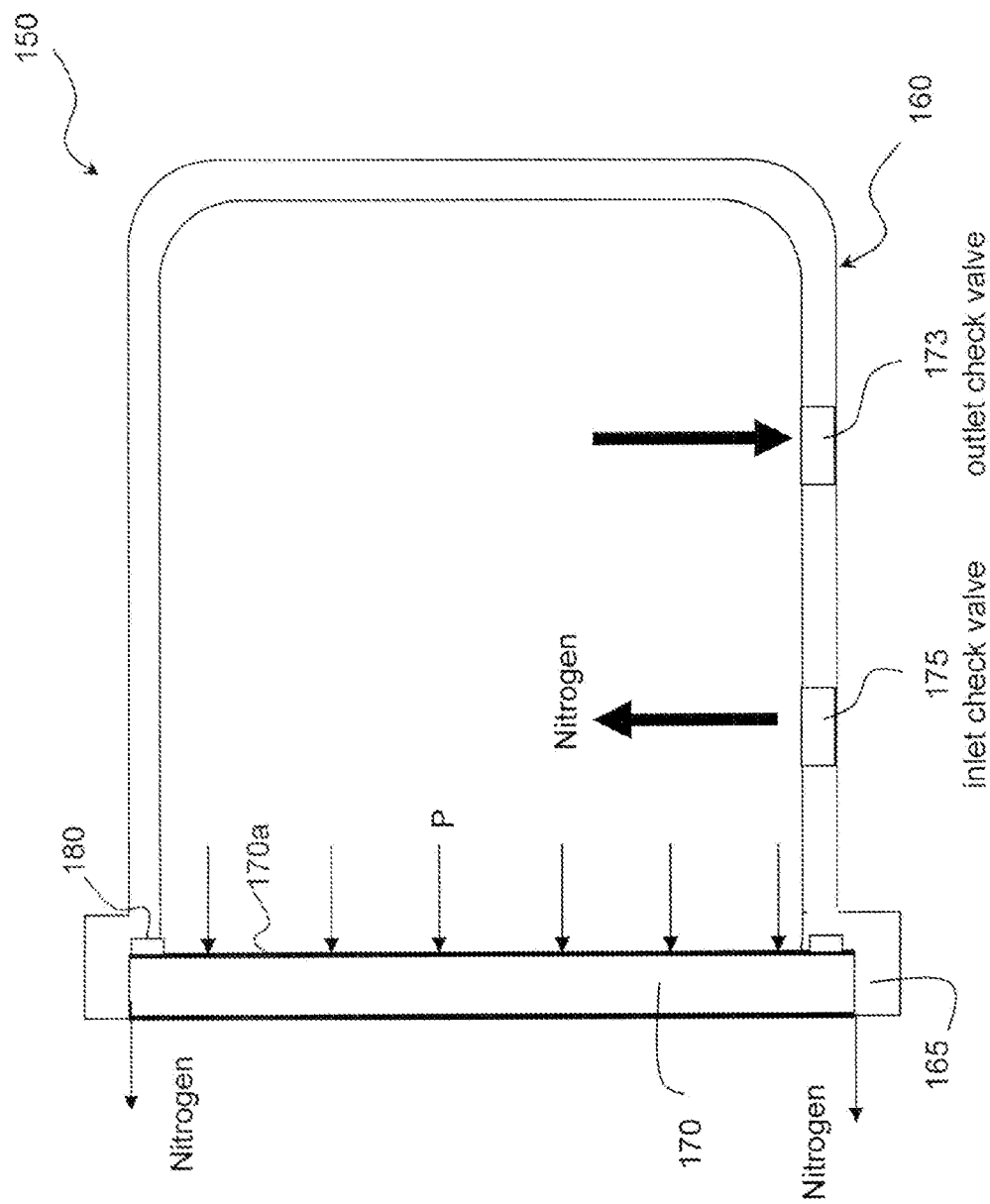
FIG. 1B is a schematic cross-sectional view of a prior art FOUP.
Figure 5:
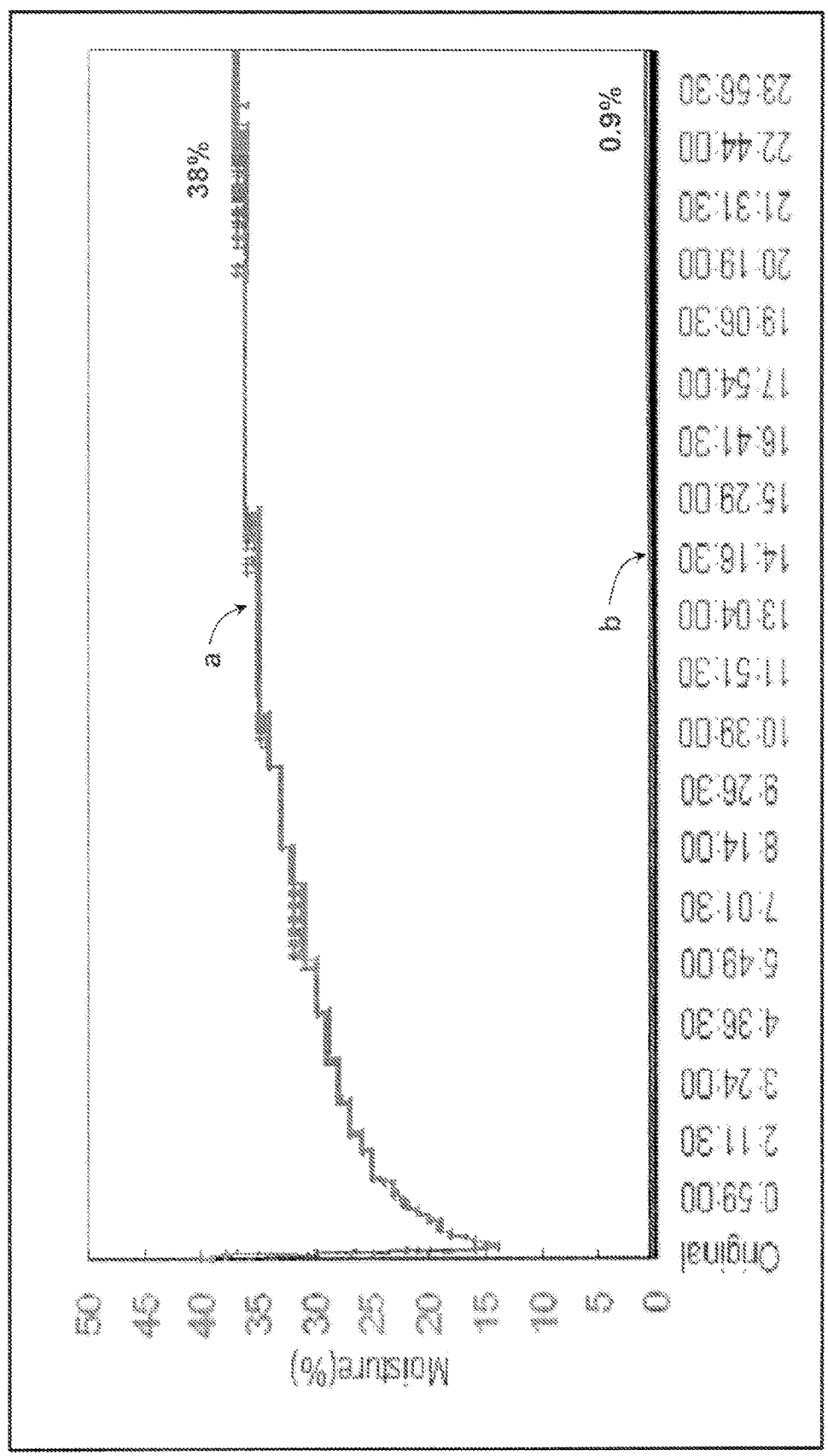
FIG. 5 is a graphic showing relationships between time and moisture percentage within a traditional FOUP shown in FIG. 1B and an exemplary FOUP shown in FIGS. 2A-2C.

FIG. 5 is a graphic showing relationships between time and moisture percentage within a traditional FOUP shown in FIG. 1B and an exemplary FOUP shown in FIGS. 2A-2C.

Referring to FIG. 5, curve "a" represents a moisture condition of a FOUP 150 (shown in FIG. 1B); and curve "b" represents a moisture condition of FOUP shown in FIGS. 8A-8C. For curve "a," a recipe has a flow rate of about 30 liters/minute (slm) and about 10-minute injection time.

It has been found that the airborne molecular contamination (AMC) percentage within the FOUP 150 drastically drops while nitrogen is injected into the closed FOUP 150 to carry away AMC from the FOUP 150 through the inlet check valve 175 (shown in FIG. 1B). After nitrogen injection ceases, the moisture percentage within the FOUP 150 increases fast during the first two hours. The injected nitrogen within the FOUP 150 increases the pressure (P) within the closed FOUP 150, which is higher than atmosphere. The pressure difference between the closed space within the FOUP 150 and atmosphere pushes the door 170 away from the enclosure 160 such that the door 170 may not desirably seal the enclosure 160 and nitrogen leaks from gaps (not shown) between the frame 165 and the door 170 and gaps (not shown) of check valves 173, 175 (shown in FIG. 1B). Moisture and/or AMC of atmosphere may also regularly flows into the FOUP 150 through the gaps. Accordingly, the moisture level within the FOUP 150 arises and the FOUP 150 cannot desirably maintain the moisture level therein even after the nitrogen purging process represented by the curve "a."

For most of the backend process, i.e., the formation of the first metallic layer, a purge step with the purging condition of the recipe "a" is used to partially remove AMC or moisture from the FOUP 150 in order to reduce the possible degradation of metallic layers and/or low-k dielectric materials formed over a wafer.

After 8-hour exposure to atmosphere, the moisture percentage within the FOUP 150 rises to between about 38%. The gradual increase of the moisture percentage may be attributed to the leakage from the gap between the door 170 and the enclosure 160 and/or the leakage from the inlet check valve 175 and/or the outlet check valve 173 and/or the material of FOUP.

In some embodiments, the material of the enclosure 210 may be formed of material such as polytetrafluoroethylene (PTFE) teflon and/or perfluoroalkoxy (PFA) teflon. In some embodiments, PTFE teflon or PFA teflon may be coated on the inside surfaces 860a of the enclosure 810. The PTFE teflon or PFA teflon enclosure 210 absorb and/or release less moisture than a traditional polycarbonate (PC) enclosure. Accordingly, the PTFE teflon or PFA teflon enclosure 810 may maintain a desired moisture level after moisture within the enclosure 810 is desirably removed.

Under the moisture condition, a metal-containing material, e.g., copper, formed over a substrate is vulnerable to oxidation and/or corrosion. A Q-time step may be provided in a manufacturing process flow to control that the substrate is subject to a subsequent processing step during a predetermined time period, or a cleaning process should be used to remove oxidant of the metal-containing material before the subsequent processing step is applied.

Unlike the FOUP 150, the FOUP shown in FIGS. 8A-8C has a moisture level is less than 1% even after 24 hours. The FOUP shown in FIGS. 8A-8C may desirably seal the enclosure 210 such that air or moisture or AMC does not flow into the enclosure 210. By maintaining the desired moisture level with the enclosure 210, a Q-time step, a purge step, a pre-clean step, a de-gas step and/or other clean step used to prevent oxidation of metallic layers and/or degradation of low-k dielectric material may be optional.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. An apparatus, comprising:
an enclosure comprising a frame surrounding an opening;
a door configured to seal the opening, the door comprising:
a first plate;
a rotational apparatus disposed over the first plate;
at least one first member with a first arm extending from a first rib of the first member, the first arm connected to the rotational apparatus;
at least one second member with a second arm extending from a second rib of the second member, the second arm connecting to the rotational apparatus;
at least one corner member having a first edge, the first edge having a shape corresponding to a shape of a corner of the frame, the corner member connected to a first end of a third arm, a second end of the third arm being connected to the rotational apparatus;
a second plate disposed over the corner member, wherein the corner member is connected to the third arm by a pivot and the corner member comprises a second edge disposed against the second plate; and
a sealing material disposed along a first longitudinal side of the first rib and a second longitudinal side of the second rib.

2. The apparatus of claim 1, wherein the sealing material is further disposed on at least one region of the first edge of the corner member.

3. The apparatus of claim 1, wherein the rotational apparatus comprises a disc having at least one groove and ends of the first and second arms are movably coupled to the rotational apparatus via pins received within the at least one groove.

4. The apparatus of claim 3, wherein the at least one groove includes a first groove having a distance from a center of the disc that varies with angular position on the disc.

5. The apparatus of claim 1, wherein the door further comprises a key slot, the rotational apparatus comprises a first gear engaged with a second gear, the first gear is engaged with the key slot and ends of the first and second arms are movably coupled to the rotational apparatus via pins received within an at least one groove.

6. The apparatus of claim 1, wherein the sealing material comprises a first sealing material region disposed along the first longitudinal side of the first rib and the second longitudinal side of the second rib, and a second sealing material region which connects edges of the first plate to the second sealing material region.

7. The apparatus of claim 1, wherein the frame has at least one groove into which the sealing material is retractably disposed.

8. The apparatus of claim 1, wherein the sealing material is fixed to at least one of a region of a first longitudinal side of the first rib and a region of a second longitudinal side of the second rib.

9. The apparatus of claim 1, wherein the first member is outwardly laterally movable with respect to the rotational apparatus and toward a first edge of the frame, the second member is outwardly laterally movable with respect to the rotational apparatus and toward a second edge of the frame, and the corner member is outwardly laterally movable with respect to the rotational apparatus toward the corner of the frame.

10. The apparatus of claim 1, wherein the first, second and third arms move outwardly responsive to rotation of the rotational apparatus to close the door by causing the first and second ribs and corner member to contact the frame.

11. The apparatus of claim 1, wherein the first arm is essentially perpendicular to the first rib, and the second arm is essentially perpendicular to the second rib, and the first and second longitudinal sides of said first and second ribs face the frame.

12. The apparatus of claim 1, further comprising:
a sealant apparatus disposed around the opening and between the frame of the enclosure and the door, wherein the sealant apparatus comprises the sealing material, and the sealing material has a hardness of about 10 Shore A or less.

13. The apparatus of claim 12, wherein the sealing material comprises a vinyl-functional polysiloxane, fumed silica and platinum compound.

14. The apparatus of claim 12, wherein the sealant apparatus comprises a hollow tube.

15. The apparatus of claim 1,
wherein the sealing material comprises a first sealant material disposed around a second sealant material, and the first sealant material has a hardness larger than that of the second sealant material.

16. An apparatus, comprising:
an enclosure comprising a frame surrounding an opening; and
a door configured to seal the opening, the door comprising:
a sealant apparatus having a fluid therein, the sealant apparatus being disposed at an edge of the door;
at least one rotational apparatus disposed on the door;
at least one body fluidly connected to the sealant apparatus, the fluid contained within the body and extending to the sealant apparatus;
the body including at least one piston; and
at least one shaft, a first end of the shaft connected to the piston and a
second end of the shaft connected to the rotational apparatus, wherein the shaft is configured to transfer the piston within the body to control flowing of the fluid within the sealant apparatus.

17. The apparatus of claim 16, wherein the sealant apparatus comprises a hollow tube having a gas or liquid therein.

18. The apparatus of claim 16, wherein the sealant apparatus comprises a first sealant material disposed around a second sealant material, and the first sealant material has a hardness larger than that of the second sealant material.

19. The apparatus of claim 16, wherein the rotational apparatus comprises a disc having at least one groove and the second end of the shaft is movably coupled to the rotational apparatus via a pin received within the groove.

20. The apparatus of claim 19, wherein a distance from the groove to a center of the disc varies with a polar angle of the disc.

21. The apparatus of claim 19, wherein the door further comprises a key slot, the rotational apparatus comprises a first gear engaged with a second gear and the key slot engages the first gear.

* * * * *